(12) United States Patent
Seo et al.

(10) Patent No.: US 8,890,204 B2
(45) Date of Patent: Nov. 18, 2014

(54) LIGHT EMITTING DEVICE

(71) Applicant: Semiconductor Energy Laboratory Co., Ltd., Kanagawa-ken (JP)

(72) Inventors: Satoshi Seo, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/168,439

(22) Filed: Jan. 30, 2014

(65) Prior Publication Data

US 2014/0145220 A1    May 29, 2014

Related U.S. Application Data

(63) Continuation of application No. 13/238,322, filed on Sep. 21, 2011, now Pat. No. 8,680,562, which is a continuation of application No. 11/376,842, filed on Mar. 16, 2006, now Pat. No. 8,026,531.

(30) Foreign Application Priority Data

Mar. 22, 2005  (JP) ................................. 2005-082731

(51) Int. Cl.
| | |
|---|---|
| H01L 33/00 | (2010.01) |
| H01L 51/52 | (2006.01) |
| H01L 33/62 | (2010.01) |
| H01L 27/32 | (2006.01) |

(52) U.S. Cl.
CPC ......... *H01L 33/62* (2013.01); *H01L 2251/5323* (2013.01); *H01L 27/3295* (2013.01); *H01L 27/3281* (2013.01); *H01L 51/5278* (2013.01); *H01L 51/5203* (2013.01); *H01L 27/3209* (2013.01)
USPC .......... 257/99; 257/E25.008; 257/90; 257/91; 438/22

(58) Field of Classification Search
CPC ................. H01L 33/62; H01L 33/486; H01L 2224/48091
USPC .......... 257/E25.008, E33.056, 40, 90, 91, 99, 257/81, 89, 103; 313/500, 502, 503, 512; 427/69; 345/76; 315/169.3; 428/917; 445/25; 438/22
See application file for complete search history.

(56) References Cited

U.S. PATENT DOCUMENTS 5,703,436 A    12/1997 Forrest et al.
(Continued)

FOREIGN PATENT DOCUMENTS

| EP | 0 855 848 A2 | 7/1998 |
|---|---|---|
| EP | 1 009 198 A1 | 6/2000 |

(Continued)

OTHER PUBLICATIONS

Office Action re Chinese application No. CN 200610067935.7, dated Oct. 24, 2008 (with English translation).
(Continued)

*Primary Examiner* — Chris Chu
(74) *Attorney, Agent, or Firm* — Husch Blackwell LLP

(57) ABSTRACT

To provide a light emitting device in which generation of cross talk between adjacent light emitting elements is suppressed, even when the light emitting device uses a light emitting element having high current efficiency. Also, to provide a light emitting device having high display quality even when the light emitting device uses a light emitting element having high current efficiency. The light emitting device has a pixel portion including a plurality of light emitting elements, wherein each of the plurality of light emitting elements includes a plurality of light emitting bodies provided between a first electrode and a second electrode and a conductive layer formed between the plurality of light emitting bodies, wherein the conductive layer is provided for each light emitting element, and wherein an edge portion of the conductive layer is covered with the plurality of light emitting bodies.

16 Claims, 21 Drawing Sheets

(56) References Cited

U.S. PATENT DOCUMENTS

| | | | |
|---|---|---|---|
| 5,821,690 A | 10/1998 | Martens et al. | |
| 5,874,803 A | 2/1999 | Garbuzov et al. | |
| 6,013,384 A | 1/2000 | Kido et al. | |
| 6,045,930 A | 4/2000 | Thompson et al. | |
| 6,107,734 A | 8/2000 | Tanaka et al. | |
| 6,166,489 A | 12/2000 | Thompson et al. | |
| 6,297,516 B1 | 10/2001 | Forrest et al. | |
| 6,423,429 B2 | 7/2002 | Kido et al. | |
| 6,486,601 B1 | 11/2002 | Sakai et al. | |
| 6,538,374 B2 | 3/2003 | Hosokawa | |
| 6,692,845 B2 | 2/2004 | Maruyama et al. | |
| 6,747,618 B2 | 6/2004 | Arnold et al. | |
| 6,756,739 B2 | 6/2004 | Miyake et al. | |
| 6,787,994 B2 | 9/2004 | Cok | |
| 6,805,602 B2 * | 10/2004 | So et al. | 445/24 |
| 6,872,472 B2 | 3/2005 | Liao et al. | |
| 6,888,304 B2 | 5/2005 | Sato | |
| 6,977,463 B2 | 12/2005 | Sato | |
| 7,030,554 B2 | 4/2006 | Liao et al. | |
| 7,037,157 B2 | 5/2006 | Murakami et al. | |
| 7,142,179 B2 | 11/2006 | Miller et al. | |
| 7,154,219 B2 | 12/2006 | Hamada et al. | |
| 7,239,081 B2 | 7/2007 | Tsutsui | |
| 7,250,722 B2 | 7/2007 | Cok et al. | |
| 7,268,485 B2 | 9/2007 | Tyan et al. | |
| 7,279,834 B2 | 10/2007 | Kanno et al. | |
| 7,303,455 B2 | 12/2007 | Murakami et al. | |
| 7,368,724 B2 | 5/2008 | Morii et al. | |
| 7,402,948 B2 | 7/2008 | Yamazaki et al. | |
| 7,436,465 B2 | 10/2008 | Moriya et al. | |
| 7,528,545 B2 | 5/2009 | Liao et al. | |
| 7,531,839 B2 | 5/2009 | Hamada et al. | |
| 7,535,440 B2 | 5/2009 | Nishi et al. | |
| 7,659,660 B2 | 2/2010 | Takahashi et al. | |
| 8,232,934 B2 | 7/2012 | Sato | |
| 2001/0045565 A1 * | 11/2001 | Yamazaki | 257/89 |
| 2001/0046611 A1 | 11/2001 | Kido et al. | |
| 2002/0173068 A1 | 11/2002 | Kido et al. | |
| 2003/0127967 A1 | 7/2003 | Tsutsui et al. | |
| 2003/0189401 A1 | 10/2003 | Kido et al. | |
| 2003/0218173 A1 | 11/2003 | Nishi et al. | |
| 2004/0027059 A1 | 2/2004 | Tsutsui | |
| 2004/0061439 A1 | 4/2004 | Cok | |
| 2004/0144976 A1 | 7/2004 | Dahmani et al. | |
| 2004/0150333 A1 | 8/2004 | Tsutsui | |
| 2004/0232410 A9 | 11/2004 | Dahmani et al. | |
| 2004/0263499 A1 | 12/2004 | Tanada et al. | |
| 2005/0012465 A1 | 1/2005 | Uchida | |
| 2005/0123751 A1 | 6/2005 | Tsutsui et al. | |
| 2005/0134173 A1 | 6/2005 | Tsutsui et al. | |
| 2005/0156197 A1 | 7/2005 | Tsutsui et al. | |
| 2005/0184659 A1 | 8/2005 | Ibe | |
| 2005/0189875 A1 | 9/2005 | Nakada | |
| 2005/0247938 A1 | 11/2005 | Okamoto et al. | |
| 2006/0132029 A1 | 6/2006 | Sato | |
| 2007/0182317 A1 | 8/2007 | Kido et al. | |
| 2007/0243786 A1 | 10/2007 | Tsutsui | |
| 2008/0272992 A1 * | 11/2008 | Kwak | 345/76 |
| 2009/0033596 A1 * | 2/2009 | Yoon et al. | 345/76 |
| 2009/0053963 A1 | 2/2009 | Takahashi et al. | |
| 2009/0195147 A1 * | 8/2009 | Song et al. | 313/504 |
| 2009/0200936 A1 * | 8/2009 | Kang et al. | 313/505 |
| 2009/0309108 A1 * | 12/2009 | Chang et al. | 257/89 |
| 2012/0119201 A1 * | 5/2012 | Ueno et al. | 257/40 |
| 2012/0256815 A1 | 10/2012 | Sato | |
| 2012/0299002 A1 * | 11/2012 | Kinoshita | 257/59 |

FOREIGN PATENT DOCUMENTS

| | | |
|---|---|---|
| EP | 1 246 245 A2 | 10/2002 |
| EP | 1 351 558 A1 | 10/2003 |
| EP | 1 385 209 A2 | 1/2004 |
| EP | 1 388 903 A2 | 2/2004 |
| EP | 1 571 709 A2 | 9/2005 |
| EP | 1 580 823 A2 | 9/2005 |
| JP | 10-270171 A | 10/1998 |
| JP | 11-283750 | 10/1999 |
| JP | 11-329748 | 11/1999 |
| JP | 11-329749 | 11/1999 |
| JP | 2001-223084 A | 8/2001 |
| JP | 2002-287666 A | 10/2002 |
| JP | 2002-289357 A | 10/2002 |
| JP | 2003-45676 | 2/2003 |
| JP | 2003-257665 A | 9/2003 |
| JP | 2003-272860 | 9/2003 |
| JP | 2003-288993 | 10/2003 |
| JP | 2003-303683 | 10/2003 |
| JP | 2003-338382 A | 11/2003 |
| JP | 2004-071558 A | 3/2004 |
| JP | 2004-95549 | 3/2004 |
| JP | 2004-119304 A | 4/2004 |
| JP | 2004-327166 A | 11/2004 |
| JP | 2005-251398 | 9/2005 |
| JP | 2005-268187 A | 9/2005 |
| JP | 2006-514400 | 4/2006 |
| WO | WO 95/06400 A1 | 3/1995 |
| WO | WO 00/01203 A1 | 1/2000 |
| WO | WO 2004/030612 A2 | 4/2004 |

OTHER PUBLICATIONS

Tang, C.W. et al., "Organic Electroluminescent Diodes," Applied Physics Letters, Sep. 21, 1987, vol. 51, No. 12, pp. 913-915.

* cited by examiner

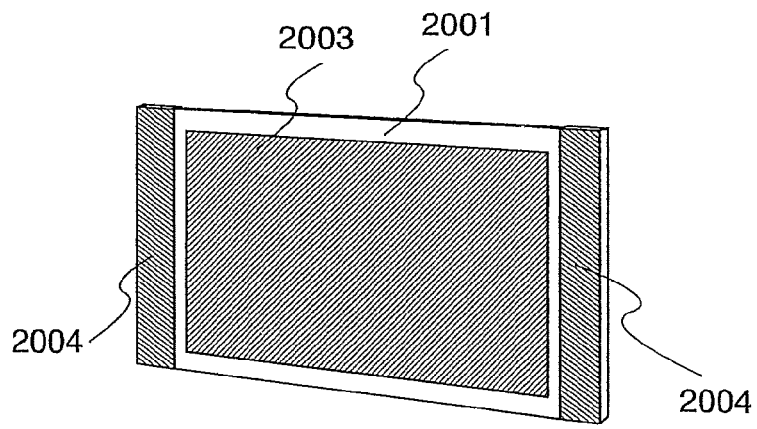
FIG. 20A
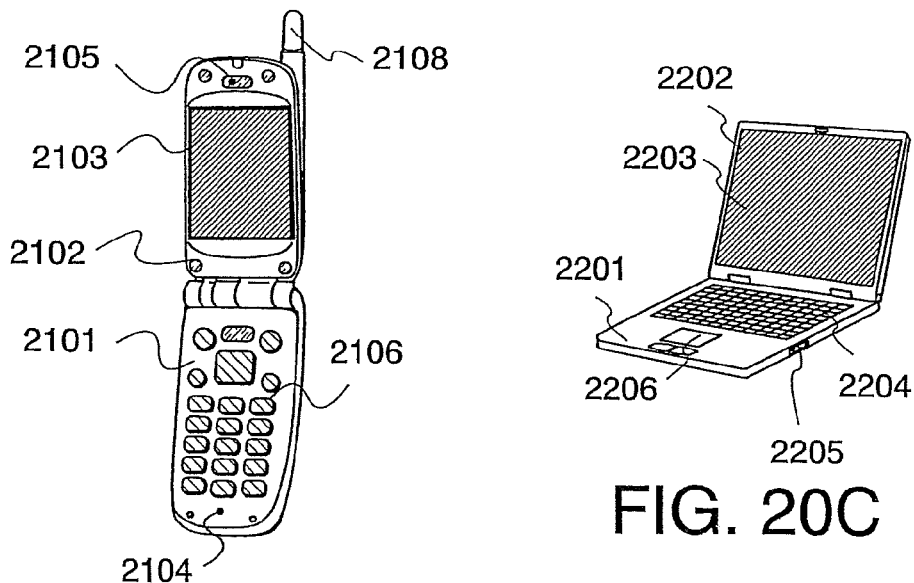
FIG. 20B
FIG. 20C
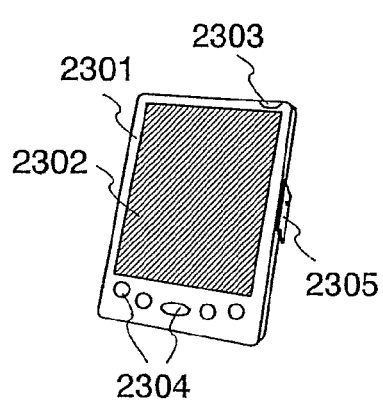
FIG. 20D
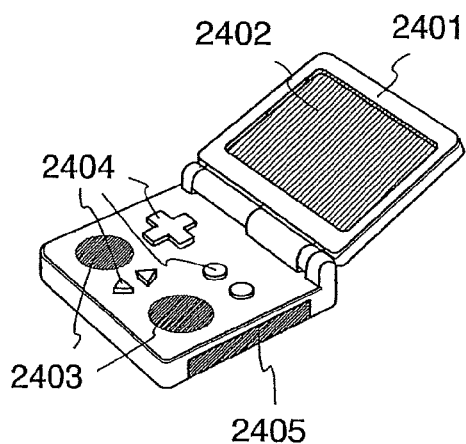
FIG. 20E

LIGHT EMITTING DEVICE

This application is a continuation of application Ser. No. 13/238,322 filed on Sep. 21, 2011 which is a continuation of application Ser. No. 11/376,842 filed on Mar. 16, 2006 (now U.S. Pat. No. 8,026,531 issued Sep. 27, 2011).

BACKGROUND OF THE INVENTION

1. Field of Invention

The present invention relates to a light emitting device including a light emitting element with high current efficiency of light emission, and having high display quality.

2. Description of the Related Art

In recent years, development of a light emitting device or a display device using a light emitting element which contains an organic material or an inorganic material, has been actively carried out. A light emitting element is manufactured by interposing an organic compound or an inorganic compound between a pair of electrodes. Differing from a liquid crystal display device, since a light emitting device using a light emitting element emits light by itself, the light emitting device requires no light sources such as a backlight. In addition, the light emitting element itself is very thin. Therefore, the light emitting device has great advantage to manufacture a thin and lightweight display.

A light emitting element has an organic material or an inorganic material between a pair of electrodes. By applying current to the light emitting element, a light emitting material is excited and so on so as to obtain a predetermined emission color. It has been known that luminance of light emission of such a light emitting element increases in proportion to the amount of current. However, it has been also known that applying the large amount of current promotes deterioration of the light emitting element. That is, although the luminance of light emission can be increased by feeding the large amount of current to the light emitting element, this promotes deterioration of the light emitting element. If high luminance can be obtained with a smaller amount of current, lifetime of the light emitting element can be prolonged.

Accordingly, it is proposed that high light-emission luminance can be obtained by laminating a plurality of light emitting elements, and by feeding current with the same amount of current density as the case of one light emitting element (see patent document 1). In accordance with the patent document 1, predetermined luminance can be obtained in the laminated light emitting elements even when current with a half the amount of current density required for one light emitting layer is fed. For example, in order to obtain n times luminance at a desired amount of current density, by providing n pieces of light emitting units each having the same structure between electrodes, n times luminance can be realized without increasing the current density in accordance with the patent document 1. In this case, the driving voltage is also increased n times or more. It is described in the patent document 1 that there is a great advantage of being capable of realizing n times luminance without shortening the lifetime.

In the case of the structure as described in the patent document 1, however, an equipotential surface is provided using indium tin oxide (ITO) between a light emitting unit and another light emitting unit. When the equipotential surface is formed across a plurality of pixels, so-called cross talk is caused by an adverse influence of potential of adjacent pixels.

Further, since the equipotential surface has a conducting property, when the equipotential surface is exposed from a light emitting unit and in contact with an electrode, initial failure due to short-circuiting is caused.

Furthermore, when the equipotential surface is formed to correspond to a light emitting region, slight misalignment is caused between the equipotential surface and the formation position of the light emitting region. Therefore, it is thought that difference in brightness might be caused within the light emitting region or a misaligned position between the equipotential surface and the light emitting region might become a non-light emitting region. Accordingly, the slight misalignment adversely affects display quality significantly.

[Patent Document 1]: Japanese Patent Application Laid-Open No. 2003-45676

SUMMARY OF THE INVENTION

An object of the present invention is to provide a light emitting device in which generation of cross talk of adjacent light emitting elements is suppressed.

Another object of the present invention is to provide a light emitting device which can inhibit generation of initial failure.

Still another object of the present invention is to provide a light emitting device including a light emitting element with high current efficiency and exhibiting high display quality.

In order to solve the above objects, in an aspect of the present invention, a light emitting device has a pixel portion including a plurality of light emitting elements, wherein each light emitting element includes a plurality of light emitting bodies, which are provided between a first electrode and a second electrode, and a conductive layer formed between the plurality of light emitting bodies, wherein the conductive layer is provided for each light emitting element, and wherein each edge portion of the conductive layer is covered with the plurality of light emitting bodies.

In another aspect of the present invention, a light emitting device has a pixel portion including a plurality of light emitting elements, wherein each light emitting element includes a plurality of light emitting bodies, which are provided between a first electrode and a second electrode, and a conductive layer formed between the plurality of light emitting bodies, and wherein an edge portion of the conductive layer is provided inside of an edge portion of each of the plurality of light emitting bodies such that the edge portion of the conductive layer does not reach the edge portion of each of the plurality of light emitting bodies.

In the light emitting device of the present invention, generation of cross talk caused by adjacent light emitting elements is inhibited.

In the light emitting device of the present invention, generation of initial failure is inhibited.

The light emitting device of the present invention exhibits high display quality and includes a light emitting element with high current efficiency.

BRIEF DESCRIPTION OF THE DRAWINGS

In the accompanying drawings:

FIGS. 20A to 20E are diagrams showing examples of electronic appliances to which the present invention can be applied.

DETAILED DESCRIPTION OF THE INVENTION

The embodiment modes according to the present invention will hereinafter be described with reference to the accompanying drawings. It is easily understood by those skilled in the art that the embodiment modes and details herein disclosed can be modified in various ways without departing from the purpose and the scope of the invention. As described above, the present invention should not be interpreted as being limited to the description of the embodiment modes to be given below.

Embodiment Mode 1

Figure 1A:
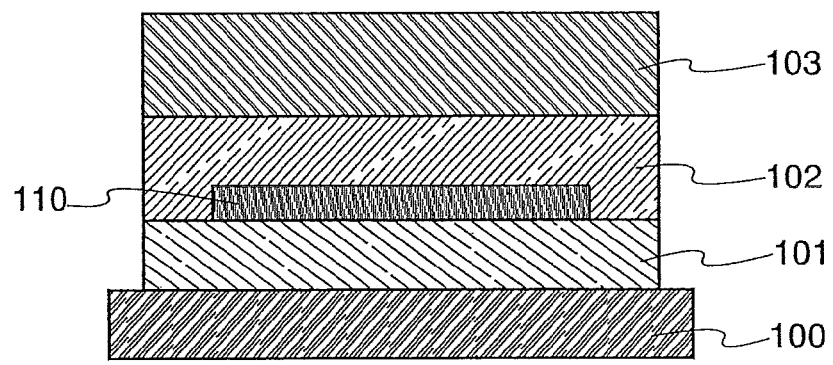
FIGS. 1A to 1C are cross sectional views of light emitting devices in accordance with the present invention.
Figure 1B:
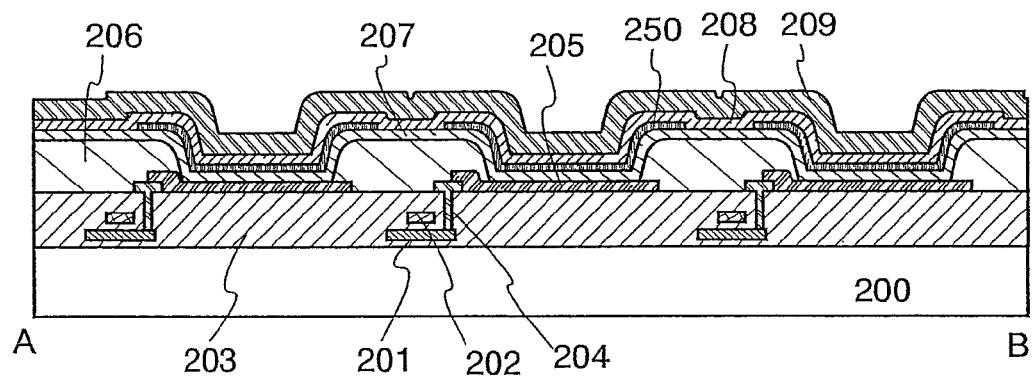
Figure 1C:
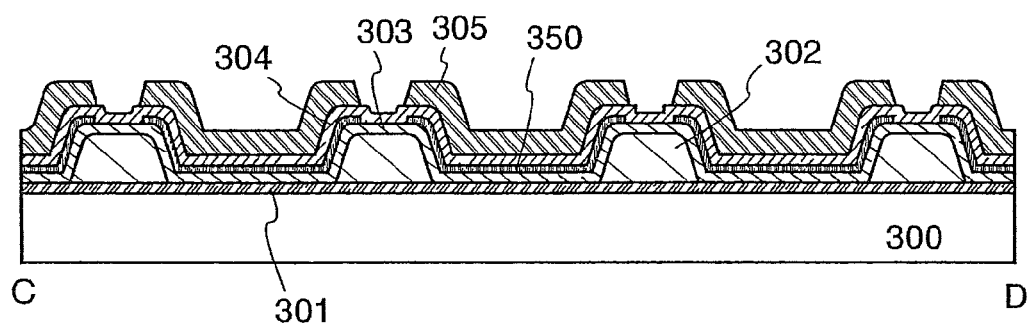

FIGS. 1A to 1C are schematic views of light emitting devices in accordance with the present invention. FIG. 1A shows one light emitting element inside of a light emitting device, including a first electrode 100, a first light emitting body 101, a second light emitting body 102, a second electrode 103, and a conductive layer 110. The conductive layer 110 is provided between the first light emitting body 101 and the second light emitting body 102, and an edge portion of the conductive layer is covered with the first and second light emitting bodies 101 and 102 so that the conductive layer is isolated from another conductive layer for each pixel.

The first electrode 100 and the second electrode 103 can be formed using metal, an alloy, an electroconductive compound, or the like. For example, metal having a conducting property such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), and titanium (Ti); an alloy such as an aluminum-silicon (Al—Si) alloy, an aluminum-titanium (Al—Ti) alloy, and an aluminum-silicon-copper (Al—Si—Cu) alloy; nitride of a metal material such as titanium nitride (TiN); a metal compound such as indium tin oxide (ITO), ITO containing silicon (ITSO), and IZO (indium zinc oxide) in which zinc oxide (ZnO) is mixed in indium oxide; and the like can be used. In the case where the first electrode 100 is used as an electrode (an electrode serving as an anode) to which higher voltage is applied than the other electrode when the light emitting element emits light, the first electrode 100 is preferably formed using a material having a large work function (4.0 eV or more) among the above mentioned materials. Meanwhile, in the case where the first electrode 100 is used as an electrode (an electrode serving as a cathode) to which lower voltage is applied than the other electrode when the light emitting element emits light, the first electrode 100 is preferably formed using a material having a small work function (3.8 eV or less) among the above mentioned materials. Further, one of the first electrode 100 and the second electrode 103 corresponds to an electrode serving as an anode, and the other corresponds to an electrode serving as a cathode.

Furthermore, an electrode through which light is emitted, is desirably formed using a material having a light transmitting property such as ITO, ITSO, and IZO. When a thick film is formed using aluminum, silver, or the like, the thick film has no-light transmitting property. However, when an extremely thin film is formed using aluminum, silver, or the like, the film has a light transmitting property, and therefore, this thin film can be used as an electrode having a light transmitting property.

Each of the first light emitting body 101 and the second light emitting body 102 includes a single layer or laminated layers at least containing a light emitting substance.

As a laminated structure of the first and second light emitting bodies 101 and 102, a functional separation type laminated structure is typically given. In the functional separation type laminated structure, a layer formed using a material having a strong hole transporting property is placed on the side of an electrode serving as an anode and a layer formed using a material having a strong electron transporting property is placed on the side of an electrode serving as a cathode while interposing a light emitting layer in which holes and electrons are recombined between these layers, and therefore, transportation of holes and electrons can be efficiently carried out. In addition, when a material having an excellent injecting property of carries, which is injected from the electrodes, is placed in contact with each electrode, injection of carriers to the light emitting bodies can be carried out smoothly.

Such a laminated structure includes various functional layers from the side of an electrode serving as an anode, such as a layer having an excellent hole injecting property (a hole injecting layer), a layer having an excellent hole transporting property (a hole transporting layer), a layer containing a light emitting substance (a light emitting layer), a layer having an excellent electron transporting property (an electron transporting layer), and a layer having an excellent electron injecting property (an electron injecting layer). Further, in addition to these layers, a layer having other function such as a blocking layer for assisting efficient recombination of electrons and holes at a light emitting layer, may also be formed. In addition, a layer having plural functions described above may be provided in the laminated structure. These functional layers are not necessary to be included in a light emitting body. Further, a light emitting body may included only a light emitting layer.

In a light emitting device of the present invention, one light emitting element has the first light emitting body 101 and the second light emitting body 102. Therefore, when the first and second light emitting bodies 101 and 102 contain different kinds of light emitting substances, which emit different colors of light from each other, a color of light emitted from the first light emitting body and another color of light emitted from the second light emitting body are mixed to make it possible to obtain mixed-color light emission from the light emitting element. Further, the number of light emitting bodies is not limited to two, and two or more light emitting bodies may be included in one light emitting element. In this case, another conductive layer 110 is provided between the light emitting bodies.

Meanwhile, as compared to a light emitting device having a single light emitting body containing a light emitting substance, when the first light emitting body 101 and the second light emitting body 102 contain the same light emitting substance, the same level of luminance can be obtained at lower current density. Further, under a condition of the same current density, about two times the luminance of the light emitting device having the single light emitting body containing the light emitting substance, can be obtained from a light emitting device having the first and second light emitting bodies containing the same light emitting substance.

As specific examples of a substance which can be used for forming a hole injecting layer, a phthalocyanine compound such as phthalocyanine (abbreviation: H$_2$PC) and copper phthalocyanine (abbreviation: CuPc); a polymer such as a poly(ethylenedioxythiophene)/poly(styrene sulfonate) solution (PEDOT/PSS); and the like can be given. A hole injecting layer can be formed by selecting a substance of which ionized potential is relatively smaller than that of a functional layer formed in contact with an opposite side of an electrode serving as an anode from substances having hole transporting properties.

As specific examples of a substance which can be used for forming a hole transporting layer, 4,4'-bis[N-(1-naphthyl)-N-phenylamine]biphenyl (abbreviation: NPB); 4,4'-bis[N-(3-methylphenyl)-N-phenylamino]biphenyl (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 4,4'-bis{N-[4-(N,N-di-m-tolylamino)phenyl]-N-phenylamino}biphenyl (abbreviation: DNTPD); 1,3,5-tris[N,N-di(m-tolyl)amino]benzene (abbreviation: m-MTDAB); 4,4',4''-tris(N-carbazolyl)triphenylamine (abbreviation: TCTA); phthalocyanine (abbreviation: H$_2$Pc); copper phthalocyanine (abbreviation: CuPc); vanadyl phthalocyanine (abbreviation: VOPc); and the like can be given. Further, the hole transporting layer may be a layer having a multilayer structure that is formed by combining two or more layers including the above mentioned substances.

Providing a hole transporting layer allows a distance between the first electrode 100 and the light emitting layer to be increased. Therefore, light quenching due to metal contained in the first electrode 100 and the like can be prevented. The hole transporting layer is preferably formed using a substance having a strong hole transporting property, and in particular, is preferably formed using a substance having hole mobility of $1 \times 10^{-6}$ cm$^2$/Vs or more.

A layer serving as a light emitting layer has two types and so on: a host-guest type layer in which a light emitting material (a guest material), which becomes a light emission center, is dispersed in a material (a host material) having a larger energy gap than that of the light emitting material; and a light emitting layer composed of only a light emitting material. As light emitting materials, 9,10-di(2-naphthyl)anthracene (abbreviation: DNA); 2-tert-butyl-9,10-di(2-naphthyl)anthracene (abbreviation: t-BuDNA); 4,4'-bis(2,2-diphenylvinyl)biphenyl (abbreviation: DPVBi); coumarin 30, coumarin 6, coumarin 545; coumarin 545T; perylene; rubrene; periflanthene; 2,5,8,11-tetra(tert-butyl)perylene (abbreviation: TPB); 9,10-diphenylanthracene (abbreviation: DPA); 5,12-diphenyltetracene; 4-(dicyanomethylene)-2-methyl-6-[p-(dimethylamino) styryl]-4H-pyran (abbreviation: DCM1); 4-(dicyanomethylene)-2-methyl-6-[2-(julolidine-9-yl)ethenyl]-4H-pyran (abbreviation: DCM2); 4-(dicyanomethylene)-2,6-bis[p-(dimethylamino) styryl]-4H-pyran (abbreviation: BisDCM); an the like can be given. In addition, it is possible to use a compound which can emit phosphorescence such as bis[2-(4',6'-difluorophenyl)pyridinato-N,C$^{2'}$](picolinato)iridium (abbreviation: FIrpic); bis{2-[3',5'-bis(trifluoromethyl)phenyl]pyridinato-N,C$^{2'}$}(picolinato)iridium (abbreviation: Ir(CF$_3$ppy)$_2$(pic)); tris(2-phenylpyridinato-N,C$^{2'}$)iridium (abbreviation: Ir(ppy)$_3$); (acetylacetonato)bis(2-phenylpyridinato-N,C$^{2'}$)iridium (abbreviation: Ir(ppy)$_2$(acac)); (acetylacetonato)bis[2-(2'-thienyl)pyridinato-N,C$^{3'}$]iridium (abbreviation: Ir(thp)$_2$(acac)); (acetylacetonato)bis(2-phenylquinolinato-N,C$^{2'}$)iridium (abbreviation: Ir(pq)$_2$(acac)); and (acetylacetonato)bis[2-(2'-benzothienyl)pyridinato-N,C$^{3'}$]iridium (abbreviation: Ir(btp)$_2$(acac)). As a host material which becomes a base material when forming a layer in which the above mentioned light emitting material is dispersed, an anthracene derivative such as 9,10-di(2-naphthyl)-2-tert-butylanthracene (abbreviation: t-BuDNA); a carbazole derivative such as 4,4'-bis(N-carbazolyl)biphenyl (abbreviation: CBP); a metal complex such as tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)-4-phenylphenolato-aluminum (abbreviation: BAlq), bis[2-(2-hydroxyphenyl)pyridinato]zinc (abbreviation: Znpp$_2$), and bis[2-(2-hydroxyphenyl)benzoxazolato]zinc (abbreviation: ZnBOX); and the like can be used. Furthermore, a light emitting layer can be formed by only using a light emitting substance such as tris(8-quinolinolato) aluminum (abbreviation: Alq$_3$), 9,10-bis(2-naphthyl)anthracene (abbreviation: DNA), and bis(2-methyl-8-quinolinolato)-4-phenylphenolato-aluminum (abbreviation: BAlq).

As specific examples of a substance which can be used for forming an electron transporting layer, tris(8-quinolinolato) aluminum (abbreviation: Alq$_3$); tris(4-methyl-8-quinolinolato)aluminum (abbreviation: Almq$_3$); bis(10-hydroxybenzo[h]-quinolinato)beryllium (abbreviation: BeBq$_2$); bis(2-methyl-8-quinolinolato)-4-phenylphenolato-aluminum (abbreviation: BAlq); bis[2-(2-hydroxyphenyl)benzoxazolato]zinc (abbreviation: Zn(BOX)$_2$); bis[2-(2-hydroxyphenyl)benzothiazolato]zinc (abbreviation: Zn(BTZ)$_2$); and the like can be given. In addition, 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-biphenylyl)-4-phenyl-5-(4-tert-butylphenyl)-1,2,4-triazole (abbreviation: TAZ); 3-(4-biphenylyl)-4-(4-ethylphenyl)-5-(4-tert-butylphenyl)-1,2,4-triazole (abbreviation: p-EtTAZ); bathophenanthroline (abbreviation: BPhen); bathocuproin (abbreviation: BCP); 2,2',2"-(1,3,5-benzenetriyl)-tris(1-phenyl-1H-benzimidazole) (abbreviation: TPBI); 4,4-bis(5-methylbenzoxazole-2-yl) stilbene (abbreviation: BzOs); and the like can be given. Further, the electron transporting layer may be a layer having a multilayer structure that is formed by combining two or more layers including the above mentioned substances.

Providing an electron transporting layer allows a distance between the second electrode 103 and the light emitting layer to be increased. Therefore, light quenching due to metal contained in the second electrode 103 can be prevented. The electron transporting layer is preferably formed using a substance having a strong electron transporting property, and in particular, is preferably formed using a substance having electron mobility of $1\times10^{-6}$ cm$^2$/Vs or more.

As specific examples of a substance which can be used for forming an electron injecting layer, inorganic materials such as alkali metal, alkali earth metal, fluoride of alkali metal, fluoride of alkali earth metal, oxide of alkali metal, and oxide of alkali earth metal can be given. In addition to the inorganic materials, a substance which can be used for forming an electron injecting layer such as BPhen, BCP, p-EtTAZ, TAZ, and BzOs can be used to form an electron injecting layer by selecting a substance having higher electron affinity than that of a substance used for forming an electron transporting layer from them. That is, an electron injecting layer can also be formed by selecting a substance having electron affinity which is relatively higher than that of an electron transporting layer from substances having electron transporting properties.

The conductive layer 110 can be formed using a transparent conductive film having a light transmitting property. Specifically, an inorganic conductive film such as ITO, ITSO, and IZO, a thin metal film having a light transmitting property, and a conductive organic compound, and the like can be given.

Further, the conductive layer 110 may be a laminated body including a layer generating holes and a layer generating electrons. This laminated body is provided by sequentially laminating a layer generating holes, and a layer generating electrons from the side of a layer serving as a cathode. The layer generating holes is formed of a composite material of an inorganic compound and an organic compound. In this layer generating holes, the inorganic compound is a substance exhibiting an electron accepting property with respect to the organic compound and the organic compound is a substance having an excellent hole transporting property. The inorganic compound is not particularly limited. Transition metal oxide is preferable for the inorganic compound. Specifically, titanium oxide, zirconium oxide, hafnium oxide, vanadium oxide, niobium oxide, tantalum oxide, chromium oxide, molybdenum oxide, tungsten oxide, manganese oxide, and rhenium oxide are preferably used. As the organic compound, the materials given for the materials of a hole transporting layer can be used. Among the materials for a hole transporting layer, aromatic amine compounds typified by TDATA, MTDATA, m-MTDAB, TPD, NPB, DNTPD, BBPB, and TCTA, easily generate holes, and therefore, they are a compound group which is suitable as an organic compound. The layer generating electrons is not particularly limited so long as it can generate electrons. Specifically, the layer generating electrons may include an organic compound having an electron transporting property and a substance exhibiting an electron donating property with respect to the organic compound. As the organic compound having the electron transporting property, the above mentioned Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ and the like can be given. As a substance exhibiting an electron donating property, alkali metal or alkali earth metal such as lithium, magnesium, calcium, and barium, or an alloy thereof can be given. Also, an alkali metal compound or an alkali earth metal compound such as lithium oxide, barium oxide, lithium nitride, magnesium nitride, and calcium nitride can be used.

Further, absorption in a visible light region of the conductive layer 110 is desirably as low as possible. Here, by using an organic material having a structure represented by the following general formulas for the layer generating holes, the degree of absorption in the visible light region on the side of light emission can be reduced.

[chemical compound 1]

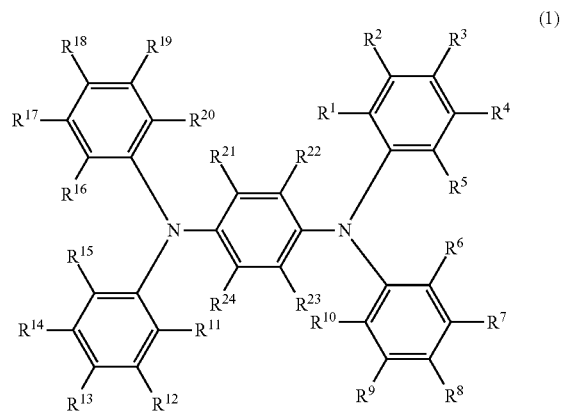

(1)

In the general formula (1), $R^1$ to $R^{24}$ may be identical to or different from one another, and represent any of hydrogen, an alkyl group, an alkoxy group, an aryl group, and an arylalkyl group.

[chemical compound 2]

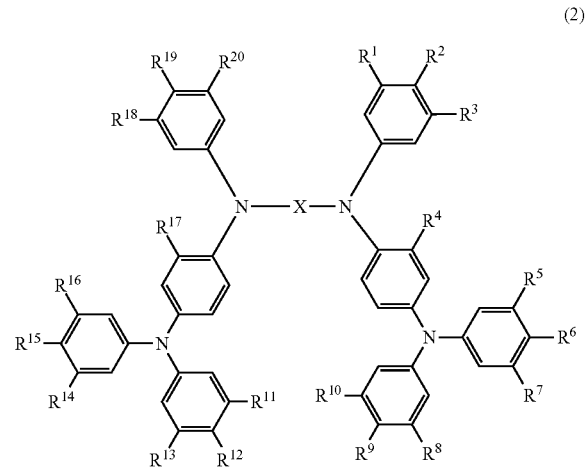

(2)

(2-1)
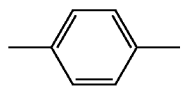

(2-2)
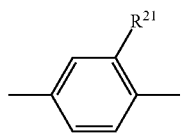

(2-3)
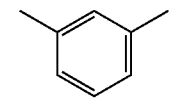

(2-4)
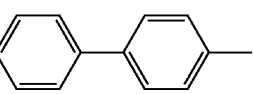

(2-5)
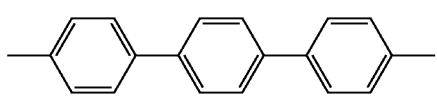

(2-6)
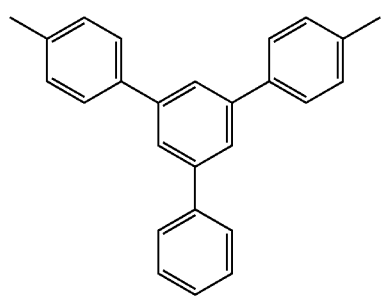

In the general formula (2), X represents any one of aromatic hydrocarbon groups represented by structural formulas (2-1) to (2-6). $R^1$ to $R^{20}$ may be identical to or different from one another, and represent any of hydrogen, an alkyl group, an alkoxy group, and an aryl group.

[chemical compound 3]

(3)
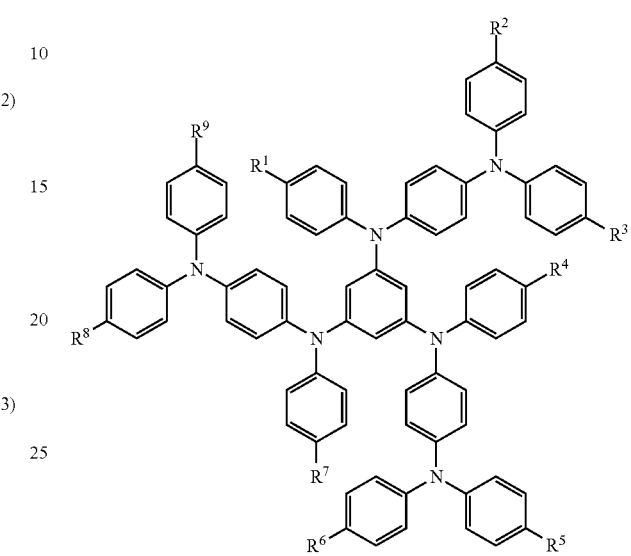

In the general formula (3), $R^1$ to $R^9$ may be identical to or different from one another, and represent any of hydrogen, an alkyl group, an alkoxy group, and an aryl group.

Further, the conductive layer 110 may be a laminated body formed by sequentially laminating a layer generating holes, a transparent conductive film, and a layer generating electrons from the side of a layer serving as a cathode.

Preferably, the conductive layer 110 has a thickness of 50 nm or less. In this case, even if the conductive layer has absorption in a visible light region, the conductive layer can reduce the influence of the absorption therein.

The conductive layer 110 is provided in each pixel and an edge portion of the conductive layer 110 is covered with the first light emitting body 101 and the second light emitting body 103. Therefore, generation of cross talk between pixels is inhibited and display quality of a light emitting device is improved. Accordingly, the light emitting device of the present invention can have high light emitting efficiency along with high display quality. In addition, since the conductive layer 110 is covered with the first light emitting body 101 and the second light emitting body 102, the second electrode 103 and the conductive layer 110 are not short circuited with each other, and therefore, initial failure caused by short-circuiting between the second electrode 103 and an edge portion of the conductive layer 110 can be eliminated.

FIG. 1B is a schematic view showing an example of an active matrix light emitting device of the present invention. Thin film transistors each including a semiconductor layer 201, a gate insulating film, and a gate electrode 202 are provided over a substrate 200. Light emitting elements each including a first electrode 205, a first light emitting body 207, a conductive layer 250, a second light emitting body 208, and a second electrode 209, are formed over the thin film transistors through an interlayer insulating film 203. An edge portion of the first electrode 205 of each light emitting element is covered with partition walls 206. Each light emitting element is formed at a portion where the first electrode 205 is exposed from the partition walls 206. Each light emitting element is electrically connected to each thin film transistor through an electrode 204 so as to control the light emission.

The substrate 200 is used as a supporting body of the thin film transistors and the light emitting elements. As a material of the substrate 200, glass, quartz, plastic (such as polyimide, acrylic, polyethylene terephthalate, polycarbonate, polyacrylate, and polyether sulfone), and the like can be used. In addition, the substrate 200 may be formed using other material so long as it can be used as a supporting body for the thin film transistors and the light emitting elements. Further, the substrate may be polished by CMP (chemical mechanical polishing), if needed.

A base insulating film including a single layer or plural layers may be provided between the substrate 200 and the semiconductor layers 201. The base insulating film is provided to prevent an element, which adversely affects a characteristic of the semiconductor film, such as alkali metal and alkali earth metal from dispersing into the semiconductor layers. Silicon oxide, silicon nitride, silicon oxide containing nitrogen, silicon nitride containing oxygen, and the like can be used to form the base insulating film. Further, when dispersion of an impurity from the substrate causes no problems, the base insulating film is not necessary to be provided.

Although a top-gate (staggered) thin film transistor is shown in the present invention, a thin film transistor having other form such as a bottom-gate (inversely staggered) thin film transistor may be employed. Accordingly, the present invention is not limited by the kinds of a transistor for driving a light emitting element and a driving method of a light emitting element.

The interlayer insulating film 203 is provided to prevent the thin film transistors from being electrically connected to the light emitting elements at an unnecessary portion. The interlayer insulating film 203 may include either a singe layer or plural layers. At least one layer included in the interlayer insulating film 203 is preferably formed using a material having a self-planarizing property such that an unevenness caused by the underlying thin film transistors can be reduced. For example, a material having a skeleton structure formed by silicon-oxygen bonds and an organic group containing at least hydrogen (such as an alkyl group and an aryl group), a fluoro group, or both an organic group containing at least hydrogen and a fluoro group, as a substituent, for example, a siloxane material is preferably used. In addition, the interlayer insulating film 203 can be formed using silicon oxide, silicon nitride, silicon oxide containing silicon nitride, silicon nitride containing silicon oxide, a low dielectric constant material, and the like.

Each light emitting element including the first electrode 205, the first light emitting body 207, the conductive layer 250, the second light emitting body 208, and the second electrode 209, has the same structure as the light emitting element described in FIG. 1A. An edge portion of the first electrode 205 of the light emitting element is covered with the partition walls 206, and a portion where the first electrode 205 is exposed from the partition walls 206 becomes a light emitting region of this light emitting element. The partition walls 206 can be formed using the same material as the material given for the interlayer insulating film 203.

The electrode 204 electrically connecting the first electrode 205 of each light emitting element to each thin film transistor is formed to have a single layer or plural layers by using aluminum, copper, an aluminum-carbon-nickel alloy, an aluminum-carbon-molybdenum alloy, and the like. In the case of a multilayer structure, for example, a laminated structure formed by laminating molybdenum, aluminum, and molybdenum over the thin film transistors; a laminated structure formed by laminating aluminum and titanium over the thin film transistors; a laminated structure formed by laminating titanium, titanium nitride, aluminum, and titanium over the thin film transistors; and the like can be given.

In the light emitting device of the present invention shown in FIG. 1B, the conductive layer 250 of the light emitting element is provided for each pixel, and an edge portion of the conductive layer 250 is covered with the first and second light emitting bodies 207 and 208, and therefore, generation of cross talk between pixels can be prevented, and the display quality of the light emitting device can be improved. Consequently, the light emitting device of the present invention has high light emitting efficiency along with high display quality. Further, since the conductive layer 250 is covered with the first and second light emitting bodies 207 and 208, there is no probability of short-circuiting between the second electrode 209 and the edge portion of the conductive layer 250, thereby eliminating initial failure caused by short-circuiting between the second electrode 209 and the conductive layer 250.

More preferably, the edge portion of the conductive layer 250 is placed to be outside of an edge portion of a light emitting region (a portion in which light emission can be obtained as seen from a surface of the substrate) of the light emitting element. In the light emitting element used in the light emitting device of the present invention, predetermined light emission is obtained only in a region where the first electrode 205 and the first light emitting body 207 are contacting as seen from the surface of the substrate, and light emission is not obtained or light emission with significantly low luminance is obtained in other region. Or, light emission with predetermined color cannot be obtained in the other region. Accordingly, when the conductive layer 250 is formed to correspond to the light emitting region, slight misalignment between the formation position of the conductive layer 250 and the formation position of the light emitting region causes defects such as decrease in the light emitting region and deterioration in display quality. However, even when there is slight misalignment between the conductive layer 250 and the light emitting region, deterioration in display quality can be reduced by placing the edge portion of the conductive layer 250 outside of the edge portion of the light emitting region. Especially, this is preferably applied to an active matrix light emitting device in which mask alignment must be carried out very strictly or a high-definition passive matrix light emitting device. Thus, deterioration in display quality and reduction in throughput caused by misalignment of a mask, and the like can be suppressed.

FIG. 1C is a schematic view showing an example of a passive matrix light emitting device of the present invention. Over a substrate 300, light emitting elements each including a first electrode 301, a first light emitting body 303, a conductive layer 350, a second light emitting body 304, and a second electrode 305, are formed. The light emitting elements sharing the first electrode 301 are isolated from one another by partition walls 302. The substrate 300, the first electrode 301, the first light emitting body 303, the conductive layer 350, the second light emitting body 304, the second electrode 305, and the partition walls 302 respectively correspond to the substrate 200, the first light emitting body 205, the first light emitting body 207, the conductive layer 250, the second light emitting body 208, the second electrode 209, and the partition walls 206 of FIG. 1B, and the same materials can be used.

In the light emitting device of the present invention shown in FIG. 1C, the conductive layer 350 of the light emitting element is provided in each pixel, and an edge portion of the conductive layer 350 is covered with the first light emitting body 303 and the second light emitting body 304, thereby preventing cross talk between pixels. Accordingly, the light emitting device of the present invention has high light emitting efficiency along with high display quality. Further, since the conductive layer 350 is covered with the first light emitting body 303 and the second light emitting body 304, there is no probability of short-circuiting between the second electrode 305 and the edge portion of the conductive layer 350, thereby eliminating initial failure caused by the short-circuiting between the second electrode 305 and the conductive, layer 350.

More preferably, the edge portion of the conductive layer 350 is placed to be outside of an edge portion of a light emitting region (a portion in which light emission can be obtained as seen from a surface of the substrate) of the light emitting element. In the light emitting element used in the light emitting device of the present invention, predetermined light emission is obtained only in a region where the first electrode 301 and the first light emitting body 303 are contacting as seen from the surface of the substrate, and light emission is not obtained or light emission with significantly low luminance is obtained in other region. Or, light emission with predetermined color cannot be obtained in the other region. Accordingly, when the conductive layer 350 is formed to correspond to the light emitting region, slight misalignment between the formation position of the conductive layer 350 and the formation position of the light emitting region causes defects such as decrease in the light emitting region and deterioration in display quality. However, even when there is slight misalignment between the conductive layer 350 and the light emitting region, deterioration in display quality can be reduced by placing the edge portion of the conductive layer 350 outside of the edge portion of the light emitting region. Especially, this is preferably applied to an active matrix light emitting device in which mask alignment must be carried out very strictly or a high-definition passive matrix light emitting device. Thus, deterioration in display quality and reduction in throughput caused by misalignment of a mask, and the like can be suppressed.

Embodiment Mode 2

Figure 2A:
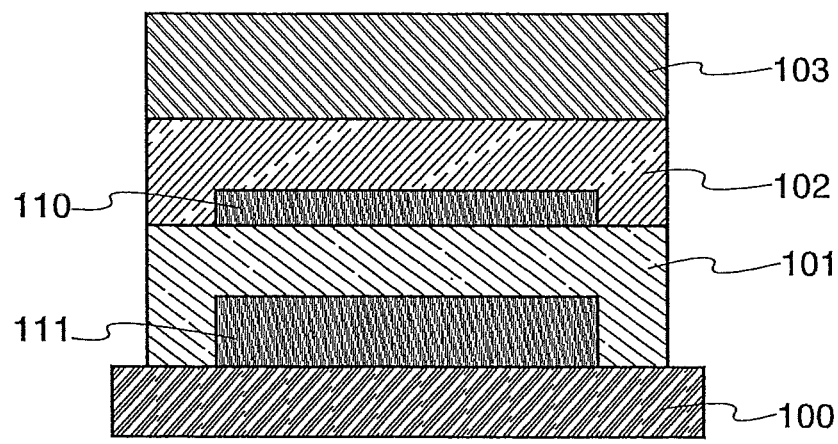
FIGS. 2A to 2C are cross sectional views of light emitting devices in accordance with the present invention.
Figure 2B:
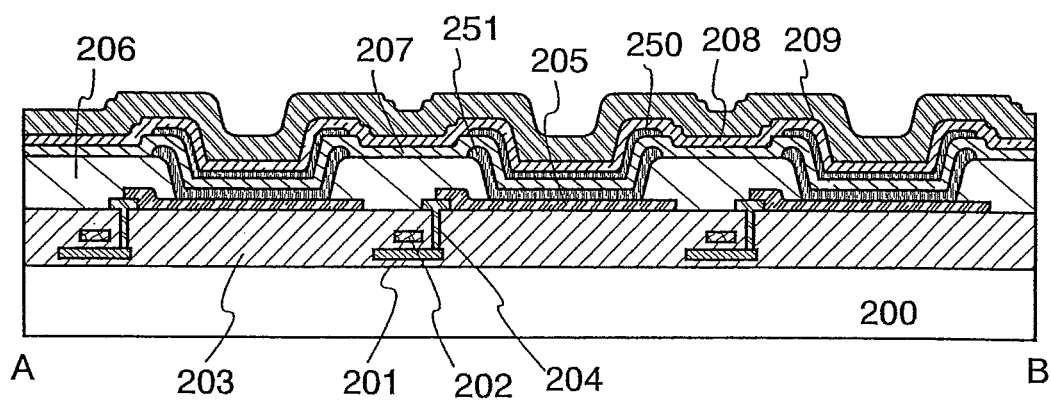
Figure 2C:
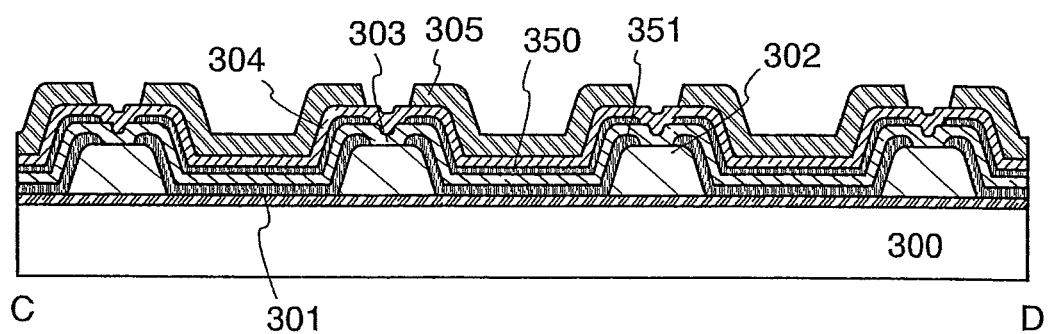

FIGS. 2A to 2C are schematic views of light emitting devices in accordance with the present invention. FIG. 2A shows one light emitting element within the light emitting device. The one pixel includes a first electrode 100, a first light emitting body 101, a second light emitting body 102, a second electrode 103, a conductive layer 110, and a conductive layer 111. The first electrode 100, the first light emitting body 101, the second light emitting body 102, the second electrode 103, and the conductive layer 110 of FIG. 2A are the same as those in FIG. 1A, and they are pursuant to explanation of FIG. 1A. The conductive layer 111 is isolated from other conductive layers for each pixel, and the same structure and the same material as the conductive layer 110 can be used for the conductive layer 111. In addition, the conductive layer 111 may be formed by using only a layer generating holes and a layer generating electrons described in the structure of the conductive layer 110 in Embodiment Mode 1.

In the light emitting device of the present invention, one light emitting element includes the first light emitting body 101 and the second light emitting body 102. Accordingly, in the case where the first light emitting body 101 and the second light emitting body 102 include different light emitting substances which emit different colors of light from each other, a color of light emitted from the first light emitting body and another color of light emitted from the second light emitting body are mixed to make it possible to obtain mixed-color light emission from the light emitting element. Note that the number of light emitting bodies is not limited to two, and two or more light emitting bodies may be provided. In this case, another conductive layer 110 may be provided between light emitting bodies.

Meanwhile, as compared to a light emitting device having a single light emitting body containing a light emitting substance, when the first light emitting body 101 and the second light emitting body 102 contain the same light emitting substance, the same level of luminance can be obtained at lower current density. Further, under a condition of the same current density, about two times the luminance of the light emitting device having the single light emitting body containing the light emitting substance, can be obtained from a light emitting device having the first and second light emitting bodies containing the same light emitting substance.

Even when the thickness of the conductive layer 111 is increased, since the resistance thereof is lower than that of the light emitting bodies, the driving voltage of the light emitting element is slightly increased. Therefore, by providing the conductive layer 111 to have an appropriate thickness, the length of an optional path through which light emission generated from each light emitting body reaches the first electrode 100, can be adjusted. Since the length of the optical path to the first electrode 100 can be adjusted, an optical design such as control of color purity or the viewing angle dependence of light emission can be performed by interference effect by using reflected light generated at an interface of the first electrode 100, thereby improving display quality. Furthermore, since the thickness of the conductive layer 111 can be increased, even when unevenness is generated over the surface of the first electrode 100 due to some sort of cause or when an extraneous material exists on the first electrode, the unevenness can be reduced or the extraneous material can be covered with the conductive layer 111. Accordingly, failure (such as short-circuiting) caused due to the unevenness or the extraneous material over the first electrode 100 can be reduced.

Since the conductive layer 110 is provided for each pixel and an edge portion of the conductive layer 110 is covered with the first light emitting body 101 and the second light emitting body 102, generation of cross talk between pixels can be suppressed, thereby improving display quality of the light emitting device. Accordingly, the light emitting device of the present invention can have high light emitting efficiency along with high display quality. In addition, since the conductive layer 110 is covered with the first light emitting body 101 and the second light emitting body 102, there is no probability of short-circuiting between the second electrode 103 and the edge portion of the conductive layer 110, and therefore, initial failure caused by short-circuiting therebetween can be eliminated.

FIG. 2B is a schematic view of an active matrix light emitting device of the present invention. Thin film transistors each including a semiconductor layer 201, a gate insulating film, and a gate electrode 202 are provided over a substrate 200. Light emitting elements each including a first electrode 205, a conductive layer 251, a first light emitting body 207, a conductive layer 250, a second light emitting body 208, and a second electrode 209, are formed over the thin film transistors through an interlayer insulating film 203. An edge portion of the first electrode 205 of each light emitting element is covered with partition walls 206. Each light emitting element is formed at a portion where the first electrode 205 is exposed from the partition walls 206. The light emitting elements are electrically connected to the thin film transistors through electrodes 204 so as to control light emission. Component parts of the light emitting device shown in FIG. 2B are the same as those of FIG. 1B with the exception of the conductive layer 251, and they are pursuant to explanation of FIG. 1B. The conductive layer 251 is isolated other conductive layers for each pixel. The same structure and the same material as the conductive layer 250 can be used for the conductive layer 251. Further, the conductive layer 251 may be formed using only a layer generating holes and a layer generating electrons described in the structure of the conductive layer 110 in Embodiment Mode 1.

Even when the thickness of the conductive layer 251 is increased, since the resistance thereof is lower than that of the light emitting bodies, the driving voltage of the light emitting element is slightly increased. Therefore, by providing the conductive layer 251 to have an appropriate thickness, the length of an optional path through which light emission generated from each light emitting body reaches the first electrode 205, can be adjusted. Since the length of the optical path to the first electrode 205 can be adjusted, an optical design such as control of color purity or the viewing angle dependence of light emission can be performed by using interference effect and by utilizing reflected light generated at an interface of the first electrode 205, thereby improving display quality. Furthermore, since the thickness of the conductive layer 251 can be increased, even when unevenness is generated over the surface of the first electrode 205 due to some sort of cause or when an extraneous material exists over the first electrode, the unevenness can be reduced or the extraneous material can be covered with the conductive layer 251. Accordingly, failure (such as short-circuiting) caused due to the unevenness or the extraneous material over the first electrode 205 can be reduced.

Since the conductive layer 250 is provided for each pixel and the edge portion of the conductive layer 250 is covered with the first light emitting body 207 and the second light emitting body 208, generation of cross talk between pixels can be suppressed, thereby improving display quality of the light emitting device. Accordingly, the light emitting device of the present invention can have high light emitting efficiency along with high display quality. In addition, since the conductive layer 250 is covered with the first light emitting body 207 and the second light emitting body 208, there is no probability of short-circuiting between the second electrode 209 and the edge portion of the conductive layer 250, and therefore, initial failure caused by short-circuiting therebetween can be eliminated.

More preferably, the edge portion of the conductive layer 250 is placed to be outside of an edge portion of a light emitting region (a portion in which light emission can be obtained as seen from a surface of the substrate) of the light emitting element. In the light emitting element used in the light emitting device of the present invention, predetermined light emission is obtained only in a region where the first electrode 205 and the conductive layer 251 are contacting as seen from the surface of the substrate, and light emission is not obtained or light emission with significantly low luminance is obtained in other region. Or, light emission with predetermined color cannot be obtained in the other region. Accordingly, when the conductive layer 250 is formed to correspond to the light emitting region, slight misalignment between the formation position of the conductive layer 250 and the formation position of the light emitting region causes defects such as decrease in the light emitting region and deterioration in display quality. However, even when there is slight misalignment between the conductive layer 250 and the light emitting region, deterioration in display quality can be reduced by placing the edge portion of the conductive layer 250 outside of the edge portion of the light emitting region. Especially, this is preferably applied to an active matrix light emitting device in which mask alignment must be carried out very strictly or a high-definition passive matrix light emitting device. Thus, deterioration in display quality and reduction in throughput caused by misalignment of a mask, and the like can be suppressed.

Further, an edge portion of the conductive layer 251 is also preferably placed to be outside of an edge portion of a light emitting region (a portion in which light emission can be obtained as seen from a surface of the substrate) of the light emitting element. Since the conductive layer 251 remains to cover the light emitting region even if slight misalignment of the conductive layer 251 is caused, this arrangement can prevent deterioration in display quality or reduction in throughput.

FIG. 2C is a schematic view showing an example of a passive matrix light emitting device of the present invention. Over a substrate 300, light emitting elements each including a first electrode 301, a conductive layer 351, a first light emitting body 303, a conductive layer 350, a second light emitting body 304, and a second electrode 305, are formed. The light emitting elements sharing the first electrode 301 are isolated from one another by partition walls 302. The structure of FIG. 2C is similar to the structure of FIG. 1C with the exception of the conductive layer 351, and is pursuant to the explanation of FIG. 1C. Each conductive layer 351 is isolated for each pixel, and the same structure and the same material of the conductive layer 350 can be used for the conductive layer 351. Further, the conductive layer 351 may be formed by using only a layer generating holes and a layer generating electrons described in the structure of the conductive layer 110 in Embodiment Mode 1.

In the light emitting device of the present invention shown in FIG. 2C, the conductive layer 350 of the light emitting element is provided in each pixel, and an edge portion of the conductive layer 350 is covered with the first light emitting body 303 and the second light emitting body 304, thereby preventing generation of cross talk between pixels and improving display quality of the light emitting device. Accordingly, the light emitting device of the present invention has high light emitting efficiency along with high display quality. Further, since the conductive layer 350 is covered with the first light emitting body 303 and the second light emitting body 304, there is no probability of short-circuiting between the second electrode 305 and the edge portion of the conductive layer 350, thereby eliminating initial failure caused by the short-circuiting between the second electrode 305 and the conductive layer 350.

More preferably, the edge portion of the conductive layer 350 is placed to be outside of an edge portion of a light emitting region (a portion in which light emission can be obtained as seen from a surface of the substrate) of the light emitting element. In the light emitting element used in the light emitting device of the present invention, predetermined light emission is obtained only in a region where the first electrode 301 and the conducive layer 351 are contacting as seen from the surface of the substrate, and light emission is not obtained or light emission with significantly low luminance is obtained in other region. Or, light emission with predetermined color cannot be obtained in the other region. Accordingly, when the conductive layer 350 is formed to correspond to the light emitting region, slight misalignment between the formation position of the conductive layer 350 and the formation position of the light emitting region causes defects such as decrease in the light emitting region and deterioration in display quality. However, even when there is slight misalignment between the conductive layer 350 and the light emitting region, deterioration in display quality can be reduced by placing the edge portion of the conductive layer 350 outside of the edge portion of the light emitting region. Especially, this is preferably applied to an active matrix light emitting device in which mask alignment must be carried out very strictly or a high-definition passive matrix light emitting device. Thus, deterioration in display quality and reduction in throughput caused by misalignment of a mask, and the like can be suppressed.

Further, an edge portion of the conductive layer 351 is also preferably placed to be outside of an edge portion of a light emitting region (a portion in which light emission can be obtained as seen from a surface of the substrate) of the light emitting element. Since the conductive layer 351 remains to cover the light emitting region even if slight misalignment of the conductive layer 351 is caused, this arrangement can prevent deterioration in display quality or reduction in throughput.

Embodiment Mode 3

Figure 3A:
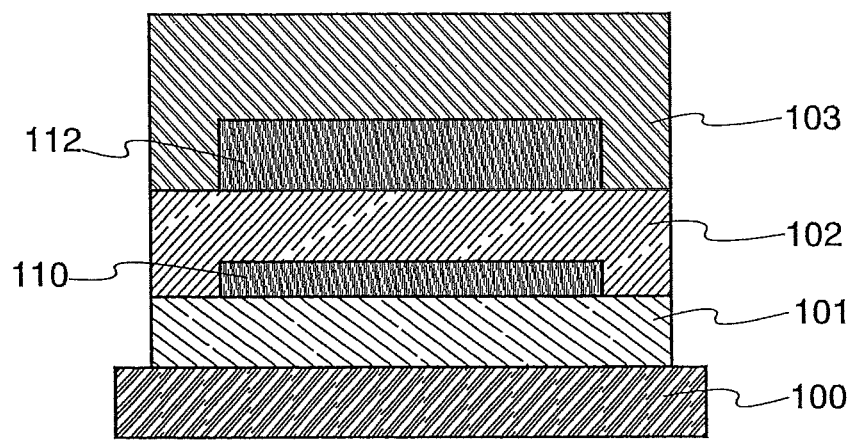
FIGS. 3A to 3C are cross sectional views of light emitting devices in accordance with the present invention.
Figure 3B:
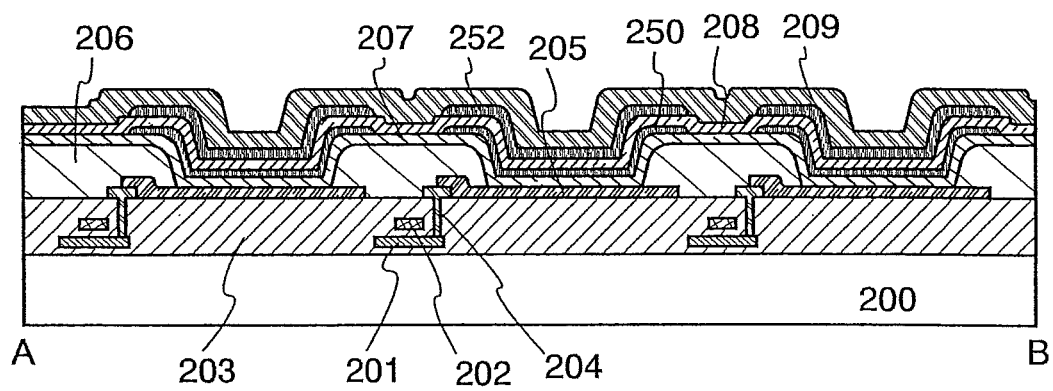
Figure 3C:
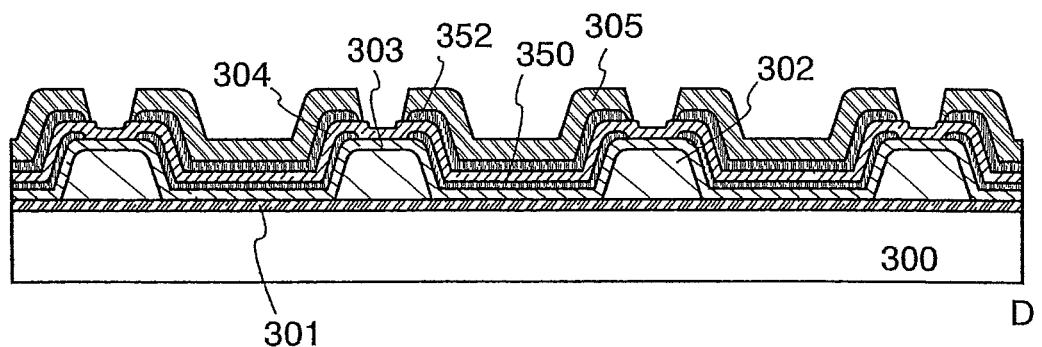

FIGS. 3A to 3C are schematic views of light emitting devices in accordance with the present invention. FIG. 3A shows one light emitting element within the light emitting device. The one pixel includes a first electrode 100, a first light emitting body 101, a second light emitting body 102, a second electrode 103, a conductive layer 110, and a conductive layer 112. The first electrode 100, the first light emitting body 101, the second light emitting body 102, the second electrode 103, and the conductive layer 110 of FIG. 3A are the same as those in FIG. 1A, and they are pursuant to explanation of FIG. 1A. The conductive layer 112 is provided between the second light emitting body 102 and the second electrode 103 and an edge portion of the conductive layer 112 is covered with the second light emitting body 102 and the second electrode 103 so that the conductive layer is isolated for each pixel. The same structure and the same material for the conductive layer 110 can be used for the conductive layer 112. In addition, the conductive layer 112 may be formed by using only a layer generating holes and a layer generating electrons described in the structure of the conductive layer 110 in Embodiment Mode 1.

In the light emitting device of the present invention, one light emitting element includes the first light emitting body 101 and the second light emitting body 102. Accordingly, in the case where the first light emitting body 101 and the second light emitting body 102 include different light emitting substances which emit different colors of light from each other, a color of light emitted from the first light emitting body and another color of light emitted from the second light emitting body are mixed to make it possible to obtain mixed-color light emission from the light emitting element. Further, the number of light emitting bodies is not limited to two, and two or more light emitting bodies may be provided. In this case, another conductive layer 110 may be provided between light emitting bodies.

Meanwhile, as compared to a light emitting device having a single light emitting body containing a light emitting substance, when the first light emitting body 101 and the second light emitting body 102 contain the same light emitting substance, the same level of luminance can be obtained at lower current density.

Even when the thickness of the conductive layer 112 is increased, since the resistance thereof is lower than that of the light emitting bodies, the driving voltage of the light emitting element is slightly increased. Therefore, by providing the conductive layer 112 to have an appropriate thickness, the length of an optional path through which light emission generated from each light emitting body reaches the second electrode 103, can be adjusted. Since the length of the optical path to the second electrode 103 can be adjusted, an optical design such as control of color purity or the viewing angle dependence of light emission can be performed by using interference effect while utilizing reflected light generated at an interface of the second electrode 103, thereby further improving display quality.

Since the conductive layer 110 is provided for each pixel and an edge portion of the conductive layer 110 is covered with the first light emitting body 101 and the second light emitting body 102, generation of cross talk between pixels can be suppressed, thereby improving display quality of the light emitting device. Accordingly, the light emitting device of the present invention can have high light emitting efficiency along with high display quality. In addition, since the conductive layer 110 is covered with the first light emitting body 101 and the second light emitting body 102, there is no probability of short-circuiting between the second electrode 103 and the edge portion of the conductive layer 110, and therefore, initial failure caused by short-circuiting therebetween can be eliminated.

FIG. 3B is a schematic view of an active matrix light emitting device of the present invention. Thin film transistors each including a semiconductor layer 201, a gate insulating film, and a gate electrode 202 are provided over a substrate 200. Light emitting elements each including a first electrode 205, a first light emitting body 207, a conductive layer 250, a second light emitting body 208, a conductive layer 252, and a second electrode 209, are formed over the thin film transistors through an interlayer insulating film 203. An edge portion of the first electrode 205 of the light emitting element is covered with partition walls 206. Each light emitting element is formed at a portion where the first electrode 205 is exposed from the partition walls 206. The light emitting elements are electrically connected to the thin film transistors through electrodes 204 so as to control light emission. A structure of the light emitting device shown in FIG. 3B is similar to the structure of FIG. 1B with the exception of the conductive layer 252, and pursuant to explanation of FIG. 1B. The conductive layer 252 is provided between the second light emitting body 208 and the second electrode 209 and an edge portion of the conductive layer 252 is covered with the second light emitting body 208 and the second electrode 209 so that the conductive layer is isolated for each pixel. The same structure and the same material as the conductive layer 250 can be used for the conductive layer 252. Further, the conductive layer 252 may be formed using only a layer generating holes and a layer generating electrons described in the structure of the conductive layer 110 in Embodiment Mode 1.

Even when the thickness of the conductive layer 252 is increased, since the resistance thereof is lower than that of the light emitting bodies, the driving voltage of the light emitting element is slightly increased. Therefore, by providing the conductive layer 252 to have an appropriate thickness, the length of an optional path through which light emission generated from each light emitting body reaches the second electrode 209, can be adjusted. Since the length of the optical path to the second electrode 209 can be adjusted, an optical design such as control of color purity or the viewing angle dependence of light emission can be performed by using interference effect while utilizing reflected light generated at an interface of the second electrode 209, making it possible to further improve display quality.

Since the conductive layer 250 is provided for each pixel and an edge portion of the conductive layer 250 is covered with the first light emitting body 207 and the second light emitting body 208, generation of cross talk between pixels can be suppressed, thereby improving display quality of the light emitting device. Accordingly, the light emitting device of the present invention can have high light emitting efficiency along with high display quality. In addition, since the conductive layer 250 is covered with the first light emitting body 207 and the second light emitting body 208, there is no probability of short-circuiting between the second electrode 209 and the edge portion of the conductive layer 250, and therefore, initial failure caused by short-circuiting therebetween can be eliminated.

More preferably, the edge portion of the conductive layer 250 is placed to be outside of an edge portion of a light emitting region (a portion in which light emission can be obtained as seen from a surface of the substrate) of the light emitting element. In the light emitting element used in the light emitting device of the present invention, predetermined light emission is obtained only in a region where the first electrode 205 and the first light emitting body 207 are contacting as seen from the surface of the substrate, and light emission is not obtained or light emission with significantly low luminance is obtained in other region. Or, light emission with predetermined color cannot be obtained in the other region. Accordingly, when the conductive layer 250 is formed to correspond to the light emitting region, slight misalignment between the formation position of the conductive layer 250 and the formation position of the light emitting region causes defects such as decrease in the light emitting region and deterioration in display quality. However, even when there is slight misalignment between the conductive layer 250 and the light emitting region, deterioration in display quality can be reduced by placing the edge portion of the conductive layer 250 outside of the edge portion of the light emitting region. Especially, this is preferably applied to an active matrix light emitting device in which mask alignment must be carried out very strictly or a high-definition passive matrix light emitting device. Thus, deterioration in display quality and reduction in throughput caused by misalignment of a mask, and the like can be suppressed.

Further, an edge portion of the conductive layer 252 is also preferably placed to be outside of an edge portion of a light emitting region (a portion in which light emission can be obtained as seen from a surface of the substrate) of the light emitting element. Since the conductive layer 252 remains to cover the light emitting region even if slight misalignment of the conductive layer 252 is caused, this arrangement can prevent deterioration in display quality or reduction in throughput.

FIG. 3C is a schematic view showing an example of a passive matrix light emitting device of the present invention. Light emitting elements each including a first electrode 301, a first light emitting body 303, a conductive layer 350, a second light emitting body 304, a conductive layer 352, and a second electrode 305, are formed over a substrate 300. The light emitting elements sharing the first electrode 301 are isolated from one another by partition walls 302. The structure of FIG. 3C is similar to the structure of FIG. 1C with the exception of the conductive layer 352, and pursuant to the explanation of FIG. 1C. The conductive layer 352 is provided between the second light emitting body 304 and the second electrode 305, and an edge portion of the conductive layer 352 is covered with the second light emitting body 304 and the second electrode 305 so that each conductive layer 352 is isolated for each pixel. The same structure and the same material of the conductive layer 350 can be used for the conductive layer 352. Further, the conductive layer 352 may be formed by using only a layer generating holes and a layer generating electrons described in the structure of the conductive layer 110 in Embodiment Mode 1.

In the light emitting device of the present invention shown in FIG. 3C, the conductive layer 350 of the light emitting element is provided in each pixel, and an edge portion of the conductive layer 350 is covered with the first light emitting body 303 and the second light emitting body 304, thereby preventing generation of cross talk between pixels while improving display quality. Accordingly, the light emitting device of the present invention has high light emitting efficiency along with high display quality. Further, since the conductive layer 350 is covered with the first light emitting body 305 and the second light emitting body 304, there is no probability of short-circuiting between the second electrode 305 and the edge portion of the conductive layer 350, thereby eliminating initial failure caused by the short-circuiting between the second electrode 305 and the conductive layer 350.

More preferably, the edge portion of the conductive layer 350 is placed to be outside of an edge portion of a light emitting region (a portion in which light emission can be obtained as seen from a surface of the substrate) of the light emitting element. In the light emitting element used in the light emitting device of the present invention, predetermined light emission is obtained only in a region where the first electrode 301 and the first light emitting body 303 are contacting as seen from the surface of the substrate, and light emission is not obtained or light emission with significantly low luminance is obtained in other region. Or, light emission with predetermined color cannot be obtained in the other region. Accordingly, when the conductive layer 350 is formed to correspond to the light emitting region, slight misalignment between the formation position of the conductive layer 350 and the formation position of the light emitting region causes defects such as decrease in the light emitting region and deterioration in display quality. However, even when there is slight misalignment between the conductive layer 350 and the light emitting region, deterioration in display quality can be reduced by placing the edge portion of the conductive layer 350 outside of the edge portion of the light emitting region. Especially, this is preferably applied to an active matrix light emitting device in which mask alignment must be carried out very strictly or a high-definition passive matrix light emitting device. Thus, deterioration in display quality and reduction in throughput caused by misalignment of a mask, and the like can be suppressed.

Further, an edge portion of the conductive layer 352 is also preferably placed to be outside of an edge portion of a light emitting region (a portion in which light emission can be obtained as seen from a surface of the substrate) of the light emitting element. Since the conductive layer 352 remains to cover the light emitting region even if slight misalignment of the conductive layer 352 is caused, this arrangement can prevent deterioration in display quality or reduction in throughput.

Embodiment Mode 4

Figure 4A:
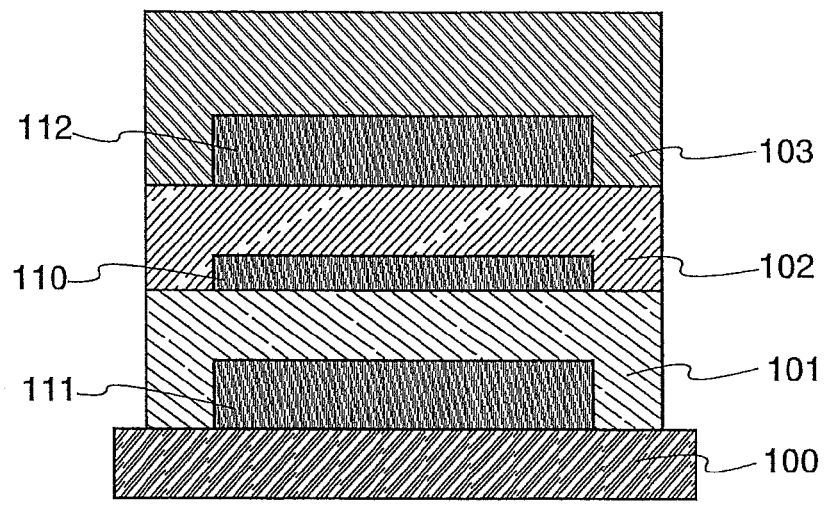
FIGS. 4A to 4C are cross sectional views of light emitting devices in accordance with the present invention.
Figure 4B:
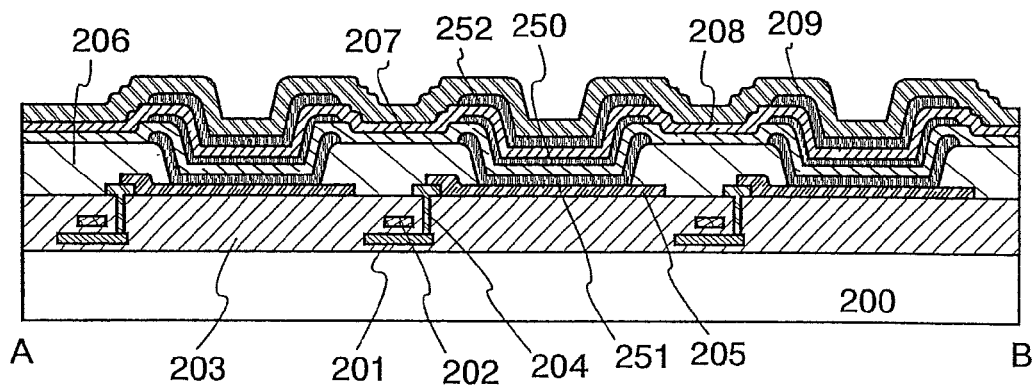
Figure 4C:
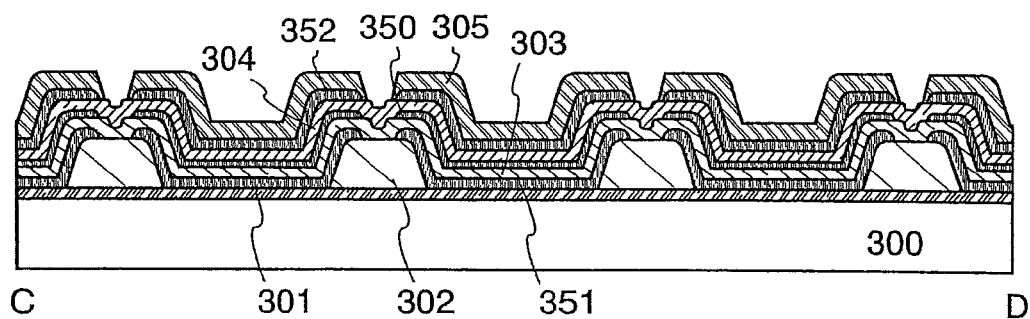

FIGS. 4A to 4C are schematic views of light emitting devices in accordance with the present invention. FIG. 4A shows one light emitting element within the light emitting device. The one pixel includes a first electrode 100, a first light emitting body 101, a second light emitting body 102, a second electrode 103, a conductive layer 110, a conductive layer 111, and a conductive layer 112. The first electrode 100, the first light emitting body 101, the second light emitting body 102, the second electrode 103, and the conductive layer 110 of FIG. 4A are the same as those in FIG. 1A, and pursuant to explanation of FIG. 1A. Further, the conductive layer 111 of FIG. 4A is pursuant to explanation of FIG. 2A whereas the conductive layer 112 of FIG. 4A is pursuant to explanation of FIG. 3A. In the light emitting device of the present invention, optical design can be performed at the both sides of the light emitting element since the conductive layers are provided at the both sides of the first electrode 100 and the second electrode 103, and therefore, the optical design can be performed more minutely. Further, since the conductive layer 111 is provided at the side of the first electrode 100, failure (such as short-circuiting) caused by an unevenness and an extraneous material over the surface of the first electrode 100 can be reduced.

In the light emitting device of the present invention, one light emitting element includes the first light emitting body 101 and the second light emitting body 102. Accordingly, in the case where the first light emitting body 101 and the second light emitting body 102 include different light emitting substances which emit different colors of light from each other, a color of light emitted from the first light emitting body and another color of light emitted from the second light emitting body are mixed to make it possible to obtain mixed-color light emission from the light emitting element. Further, the number of light emitting bodies is not limited to two, and two or more light emitting bodies may be included in one light emitting element. In this case, another conductive layer 110 is provided between the light emitting bodies.

Meanwhile, as compared to a light emitting device having a single light emitting body containing a light emitting substance, when the first light emitting body 101 and the second light emitting body 102 contain the same light emitting substance, the same level of luminance can be obtained at lower current density.

Since the conductive layer 110 is provided for each pixel and the edge portion of the conductive layer 110 is covered with the first light emitting body 101 and the second light emitting body 102, generation of cross talk between pixels can be suppressed, thereby improving display quality of the light emitting device. Accordingly, the light emitting device of the present invention can have high light emitting efficiency along with high display quality. In addition, since the conductive layer 110 is covered with the first light emitting body 101 and the second light emitting body 102, there is no probability of short-circuiting between the second electrode 103 and the edge portion of the conductive layer 110, and therefore, initial failure caused by short-circuiting therebetween can be eliminated.

FIG. 4B is a schematic view of an active matrix light emitting device of the present invention. Thin film transistors each including a semiconductor layer 201, a gate insulating film, and a gate electrode 202 are provided over a substrate 200. Light emitting elements each including a first electrode 205, a conductive layer 251, a first light emitting body 207, a conductive layer 250, a second light emitting body 208, a conductive layer 252, and a second electrode 209, are formed over the thin film transistor through an interlayer insulating film 203. An edge portion of the first electrode 205 of each light emitting element is covered with partition walls 206. Each light emitting element is formed at a portion where the first electrode 205 is exposed from the partition walls 206. The light emitting elements are electrically connected to the thin film transistors through electrodes 204 so as to control light emission. A structure of the light emitting device shown in FIG. 4B is similar to the structure of FIG. 1B with the exception of the conductive layers 251 and 252, and pursuant to explanation of FIG. 1B. Further, the conductive layer 251 is pursuant to explanation of FIG. 2B whereas the conductive layer 252 is pursuant to explanation of FIG. 3B. In the light emitting device of the present invention, optical design can be performed at the both sides of the light emitting element since the conductive layers are provided at the both sides of the first electrode 205 and the second electrode 209, and therefore, the optical design can be performed more minutely. Further, since the conductive layer 251 is provided at the side of the first electrode 205, failure (such as short-circuiting) caused by an unevenness and an extraneous material over the surface of the first electrode 205 can be reduced.

In the light emitting device of the present invention shown in FIG. 4B, since the conductive layer 250 is provided for each light emitting element and an edge portion of each conductive layer 250 is covered with the first light emitting body 207 and the second light emitting body 208, generation of cross talk between pixels can be suppressed, thereby improving display quality of the light emitting device. Accordingly, the light emitting device of the present invention can have high light emitting efficiency along with high display quality. In addition, since the conductive layer 250 is covered with the first light emitting body 207 and the second light emitting body 208, there is no probability of short-circuiting between the second electrode 209 and the edge portion of the conductive layer 250, and therefore, initial failure caused by short-circuiting therebetween can be eliminated.

More preferably, the edge portion of the conductive layer 250 is placed to be outside of an edge portion of a light emitting region (a portion in which light emission can be obtained as seen from a surface of the substrate) of the light emitting element. In the light emitting element used in the light emitting device of the present invention, predetermined light emission is obtained only in a region where the first electrode 205 and the conductive layer 251 are contacting as seen from the surface of the substrate, and light emission is not obtained or light emission with significantly low luminance is obtained in other region. Or, light emission with predetermined color cannot be obtained in the other region. Accordingly, when the conductive layer 250 is formed to correspond to the light emitting region, slight misalignment between the formation position of the conductive layer 250 and the formation position of the light emitting region causes defects such as decrease in the light emitting region and deterioration in display quality. However, even when there is slight misalignment between the conductive layer 250 and the light emitting region, deterioration in display quality can be reduced by placing the edge portion of the conductive layer 250 outside of the edge portion of the light emitting region. Especially, this is preferably applied to an active matrix light emitting device in which mask alignment must be carried out very strictly or a high-definition passive matrix light emitting device. Thus, deterioration in display quality and reduction in throughput caused by misalignment of a mask, and the like can be suppressed.

Further, an edge portion of the conductive layer 251 and an edge portion the conductive layer 252 are also preferably placed to be outside of an edge portion of a light emitting region (a portion in which light emission can be obtained as seen from a surface of the substrate) of the light emitting element. Since the conductive layers 251 and 252 remain to cover the light emitting region even if slight misalignment of the conductive layers 251 and 252 is caused, this arrangement can prevent deterioration in display quality or reduction in throughput.

FIG. 4C is a schematic view showing an example of a passive matrix light emitting device of the present invention. Over a substrate 300, light emitting elements each including a first electrode 301, a conductive layer 351, a first light emitting body 303, a conductive layer 350, a second light emitting body 304, a conductive layer 352, and a second electrode 305, are formed. The light emitting elements sharing the first electrode 301 are isolated from one another by partition walls 302. The structure of FIG. 4C is similar to the structure of FIG. 1C with the exception of the conductive layers 351 and 352, and pursuant to the explanation of FIG. 1C. The conductive layer 351 of FIG. 4C is pursuant to the explanation of FIG. 2C and the conductive layer 352 of FIG. 4C is pursuant to the explanation of FIG. 3C. In the light emitting device of the present invention, optical design can be performed at the both sides of the light emitting element since the conductive layers are provided at the both sides of the first electrode 301 and the second electrode 305, and therefore, the optical design can be performed more minutely. Further, since the conductive layer 351 is provided at the side of the first electrode 301, failure (such as short-circuiting) caused by an unevenness and an extraneous material over the surface of the first electrode 301 can be reduced.

In the light emitting device of the present invention shown in FIG. 4C, the conductive layer 350 of the light emitting element is provided in each pixel, and an edge portion of the conductive layer 350 is covered with the first light emitting body 303 and the second light emitting body 304, thereby preventing cross talk between pixels and improving display quality of the light emitting device. Accordingly, the light emitting device of the present invention has high light emitting efficiency along with high display quality. Further, since the conductive layer 350 is covered with the first light emitting body 305 and the second light emitting body 304, there is no probability of short-circuiting between the second electrode 305 and the edge portion of the conductive layer 350, making it possible to eliminate initial failure caused by the short-circuiting between the second electrode 305 and the conductive layer 350.

More preferably, the edge portion of the conductive layer 350 is placed to be outside of an edge portion of a light emitting region (a portion in which light emission can be obtained as seen from a surface of the substrate) of the light emitting element. In the light emitting element used in the light emitting device of the present invention, predetermined light emission is obtained only in a region where the first electrode 301 and the conductive layer 351 are contacting as seen from the surface of the substrate, and light emission is not obtained or light emission with significantly low luminance is obtained in other region. Or, light emission with predetermined color cannot be obtained in the other region. Accordingly, when the conductive layer 350 is formed to correspond to the light emitting region, slight misalignment between the formation position of the conductive layer 350 and the formation position of the light emitting region causes defects such as decrease in the light emitting region and deterioration in display quality. However, even when there is slight misalignment between the conductive layer 350 and the light emitting region, deterioration in display quality can be reduced by placing the edge portion of the conductive layer 350 outside of the edge portion of the light emitting region. Especially, this is preferably applied to an active matrix light emitting device in which mask alignment must be carried out very strictly or a high-definition passive matrix light emitting device. Thus, deterioration in display quality and reduction in throughput caused by misalignment of a mask, and the like can be suppressed.

Further, an edge portion of the conductive layer 351 and an edge portion of the conductive layer 352 are also preferably placed to be outside of an edge portion of a light emitting region (a portion in which light emission can be obtained as seen from a surface of the substrate) of the light emitting element. Since the conductive layers 351 and 352 remain to cover the light emitting region even if slight misalignment of the conductive layers 351 and 352 is caused, this arrangement can prevent deterioration in display quality or reduction in throughput.

Embodiment Mode 5

Figure 5A:
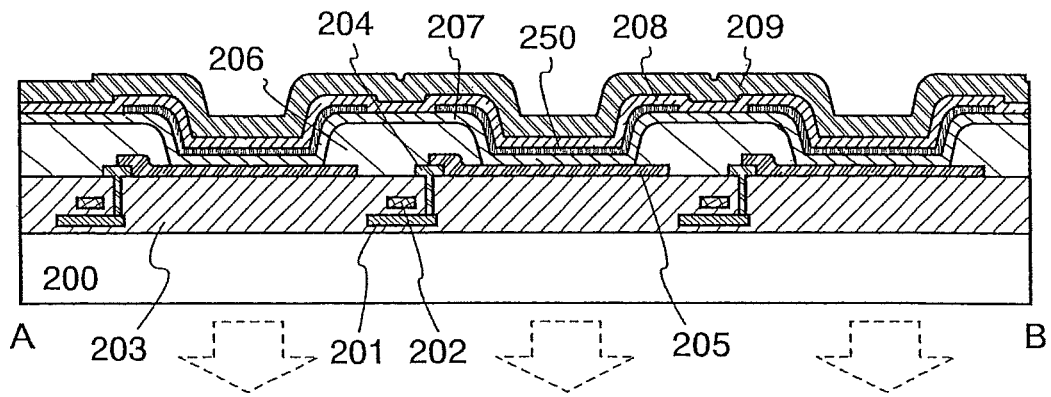
FIGS. 5A to 5C are cross sectional views of light emitting devices in accordance with the present invention.
Figure 5B:
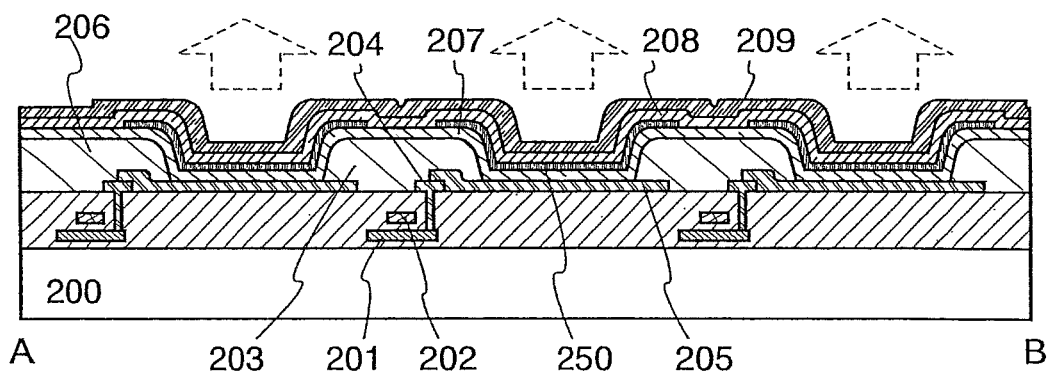
Figure 5C:
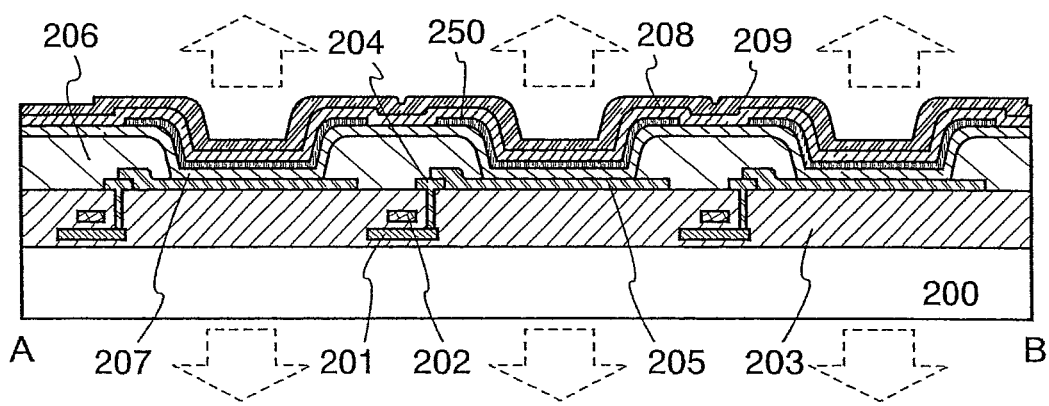

Examples of active matrix light emitting devices in which light emitting directions from each light emitting element are different from one another will be shown in FIGS. 5A to 5C. Further, FIGS. 5A to 5C are diagrams shown for explaining light emitting directions of the light emitting devices, and a light emitting device of the present invention is not limited to these structures. A shape of a thin film transistor, and the like can, of course, be arbitrarily selected. Reference numerals used in Embodiment Modes 1 to 4 are also used in FIGS. 5A to 5C. FIG. 5A shows a structure in which light generated in a light emitting element is emitted toward a substrate over which a thin film transistor is provided. In this case, in order to transmit light through a first electrode 205, the first electrode 205 is formed using a material having a light transmitting property. FIG. 5B is a structure in which light generated from a light emitting element is emitted to the opposite side of the thin film transistor. In this case, a second electrode 209 is formed using a material having a light transmitting property. FIG. 5C is a structure in which light generated from a light emitting element is emitted both through the substrate side and the opposite side. In this case, a first electrode 205 and a second electrode 209 are both formed using a material having a light transmitting property. As a material for the first electrode 205 and the second electrode 209, a material having a light transmitting property typified by ITO may be selected from the materials for the first electrode 100 and the second electrode 103 described in Embodiment Mode 1.

The present embodiment mode can be implemented by being freely combined with Embodiment Modes 1 to 4.

Embodiment Mode 6

Figure 6A:
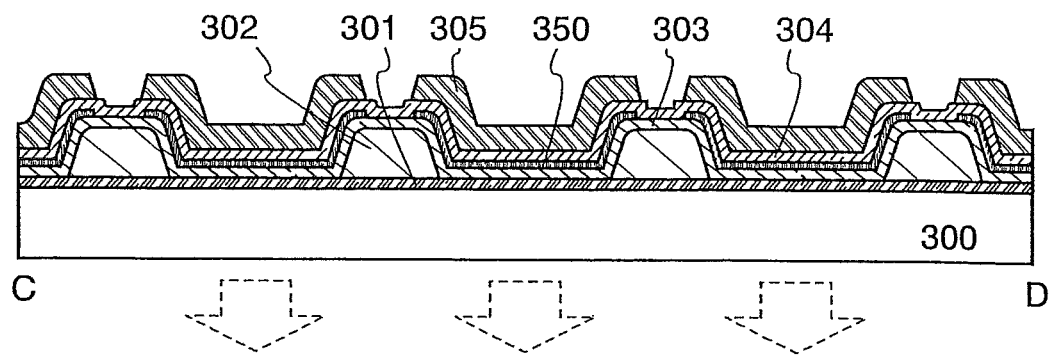
FIGS. 6A to 6C are cross sectional views of light emitting devices in accordance with the present invention.
Figure 6B:
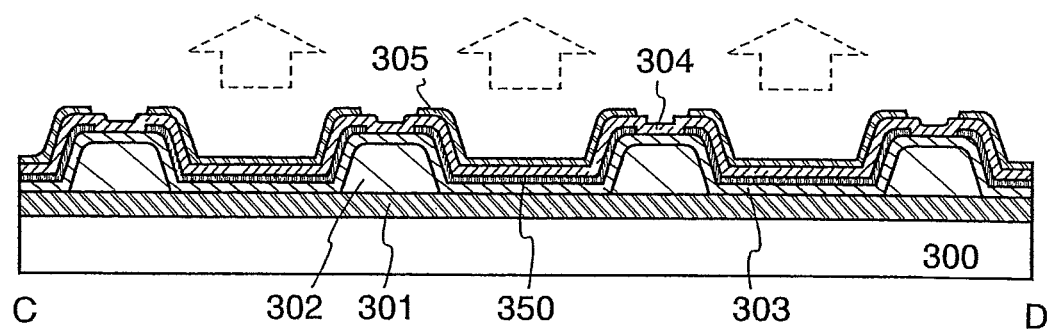
Figure 6C:
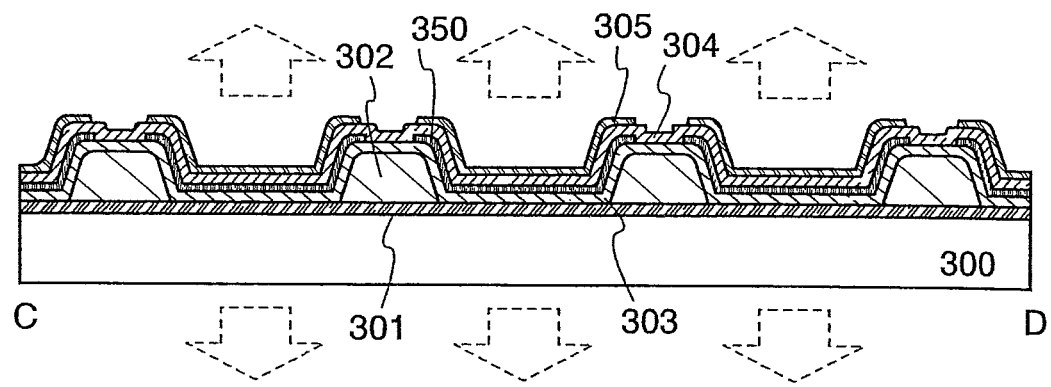

Examples of passive matrix light emitting devices in which light emitting directions from each light emitting element are different from one another will be shown in FIGS. 6A to 6C. Further, FIGS. 6A to 6C are diagrams illustrated for explaining light emitting directions of the light emitting devices, and a light emitting device of the present invention is not limited to these structures. A shape of a thin film transistor, and the like can, of course, be arbitrarily selected. Reference numerals used in Embodiment Modes 1 to 4 are also used in FIGS. 6A to 6C. FIG. 6A shows a structure in which light generated in a light emitting element is emitted toward a substrate over which a first electrode 301 is provided. In this case, in order to transmit light through the first electrode 301, the first electrode 301 is formed using a material having a light transmitting property. FIG. 6B is a structure in which light generated from a light emitting element is emitted toward the opposite side of the first electrode 301. In this case, a second electrode 305 is formed using a material having a light transmitting property. FIG. 6C is a structure in which light generated from a light emitting element is emitted both through the substrate side and the opposite side. In this case, a first electrode 301 and a second electrode 305 are both formed using a material having a light transmitting property. As a material for the first electrode 301 and the second electrode 305, a material having a light transmitting property typified by ITO may be selected from the materials for the first electrode 301 and the second electrode 305 described in Embodiment Mode 1.

The present embodiment mode can be implemented by being freely combined with Embodiment Modes 1 to 4.

Embodiment Mode 7

A light emitting device of the present invention and a method for manufacturing thereof will be described in this embodiment mode with reference to FIGS. 7A to 7E and FIGS. 8A to 8C. An example of manufacturing an active matrix light emitting device will be described in this embodiment mode.

Figure 7A:
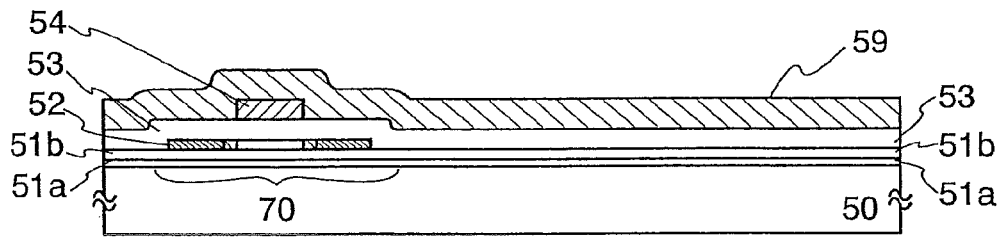
FIGS. 7A to 7E are cross sectional views explaining a method for manufacturing an active matrix light emitting device in accordance with the present invention.

After forming a first base insulating layer 51a and a second base insulating layer 51b over a substrate 50, a semiconductor layer is formed over the second base insulating layer 51b (FIG. 7A).

As a material for the substrate 50, glass, quartz, plastic (such as polyimide, acrylic, polyethylene terephthalate, polycarbonate, polyacrylate, and polyether sulfone), or the like can be used. A substrate made from such a material may be used by being polished with CMP or the like. In this embodiment mode, a glass substrate is used.

Providing the first base insulating layer 51a and the second base insulating layer 51b can prevent an element which adversely affects a characteristic of the semiconductor film such as alkali metal and alkali earth metal from dispersing into the semiconductor film. As a material for the first base insulating layer 51a and the second base insulating layer 51b, silicon oxide, silicon nitride, silicon oxide containing nitrogen, silicon nitride containing oxygen, and the like can be used. In this embodiment mode, the first base insulating layer 51a is formed using silicon nitride and the second base insulating layer 51b is formed using silicon oxide. Although a base insulating film is formed using the first base insulating layer 51a and the second base insulating layer 51b in this embodiment mode, the base insulating film may be formed using a single layer or two or more layers. In addition, when dispersion of an impurity from the substrate causes no problems, these base insulating layers are not necessary to be provided.

The semiconductor layer formed after the formation of the first and second base insulating layers, is obtained by irradiating an amorphous silicon film with laser beam. Specifically, an amorphous silicon film is formed over the second base insulating layer 51b to have a thickness of 25 to 100 nm (preferably, 30 to 60 nm). As a method for forming the amorphous silicon film, a known method such as sputtering, reduced pressure CVD, and plasma CVD can be used. Thereafter, a heat treatment is performed at 500° C. for 1 hour to perform dehydrogenation.

Subsequently, the amorphous silicon film is crystallized by using a laser irradiation apparatus to form a crystalline silicon film. In the laser crystallization of this embodiment mode, an excimer laser is used, and laser beam oscillated from the excimer laser is processed into a linear beam spot using an optical system. Then, the amorphous semiconductor film is irradiated with the linear beam spot so as to obtain the crystalline silicon film. This crystalline silicon film is used as a semiconductor layer.

As another methods for crystallizing an amorphous silicon film, there are a crystallization method only using a heat treatment, a crystallization method performing a heat treatment by using a catalytic element for accelerating crystallization, and the like. As an element for accelerating crystallization, nickel, iron, palladium, tin, lead, cobalt, platinum, copper, gold, and the like can be given. As compared to a case where crystallization is performed only by a heat treatment, when crystallization is performed using such an element for accelerating crystallization, crystallization is performed at lower temperature for shorter times, which results in less damage to the glass substrate and the like. When crystallization is performed only by a heat treatment, a quartz substrate which is resistant to heat or the like may be used as the substrate 50.

Next, in order to control a threshold value, a minute amount of an impurity may be added to the semiconductor layer, if necessary. That is, channel doping is performed. To obtain a required threshold value, an impurity (such as phosphorous and boron) having an N-type conductivity or a P-type conductivity is added to the semiconductor layer by ion doping or the like.

Thereafter, the semiconductor layer is patterned into a predetermined shape as shown in FIG. 7A to obtain an island-like semiconductor layer 52. This step is performed by applying a photoresist to the semiconductor layer, exposing and baking it into a predetermined mask shape to form a resist mask over the semiconductor layer, and etching the semiconductor layer while using the resist mask.

Subsequently, a gate insulating layer 53 is formed to cover the semiconductor layer 52. The gate insulating layer 53 is formed using an insulating layer containing silicon to have a thickness of 40 to 150 nm by plasma CVD or sputtering. In this embodiment mode, the gate insulating layer 53 is formed using silicon oxide.

A gate electrode 54 is formed over the gate insulating layer 53. The gate electrode 54 is formed using an element selected from tantalum, tungsten, titanium, molybdenum, aluminum, copper, chromium, and niobium; or an alloy material or a compound material mainly containing the above mentioned element. Further, a semiconductor film typified by a polycrystalline silicon film doped with an impurity element such as phosphorous may be used. In addition, an AgPdCu alloy may be used.

Although the gate electrode 54 including a single layer is formed in this embodiment mode, the gate electrode 54 may be formed to have a laminated structure including two or more layers such as a lower layer made from tungsten and an upper layer made from molybdenum. When the gate electrode including a laminated structure is formed, the above mentioned materials may be used. Further, a combination of the above mentioned materials may arbitrarily be selected. The gate electrode 54 is etched utilizing a mask made from a photoresist.

Subsequently, a high concentration impurity is added to the semiconductor layer 52 while utilizing the gate electrode 54 as a mask. Thus, a thin film transistor 70 including the semiconductor layer 52, the gate insulating layer 53, and the gate electrode 54 is formed.

Further, the steps of manufacturing the thin film transistor are not particularly limited, and the steps thereof may arbitrarily be changed to obtain a thin film transistor with a predetermined structure.

A tog-gate type thin film transistor using the crystalline silicon film, which is crystallized by using laser crystallization, is formed in this embodiment mode. Alternatively, a bottom-gate type thin film transistor using an amorphous semiconductor film can be used for a pixel portion. The amorphous semiconductor film can use not only silicon but also silicon germanium. When using silicon germanium, the concentration of germanium is preferably set to be about 0.01 to 4.5 atomic %.

Further, a microcrystalline semiconductor film (semiamorphous semiconductor) in which 0.5 to 20 nm crystals can be observed in an amorphous semiconductor, may be used. Fine crystals with a size of 0.5 to 20 nm are also referred to as microcrystals (μc).

Semiamorphous silicon (also referred to as SAS), which is a semiamorphous semiconductor, can be obtained by glow discharge decomposition of $SiH_4$, $Si_2H_6$, $SiH_2Cl_2$, $SiHCl_3$, $SiCl_4$, $SiF_4$ and the like. By diluting such a material with hydrogen or a mixture of hydrogen and one or more rare gas elements selected from helium, argon, krypton, and neon, the SAS can be formed easily. The dilution ratio is set to be in the range of 1:10 to 1:1,000. The semiamorphous silicon is formed by glow discharge decomposition at the pressure of about 0.1 to 133 Pa. The high-frequency power for glow discharge may be set to be 1 to 120 MHz, and preferably, 13 to 60 MHz. A substrate heating temperature may be set to be 300° C. or less, and preferably, 100 to 250° C.

Raman spectrum due to L-O phonon is shifted toward lower wavenumbers than 520 cm$^{-1}$. The diffraction peaks of (111) and (220), which are believed to be derived from Si crystal lattice, are observed in the semiamorphous semiconductor by the X-ray diffraction. The semiamorphous semiconductor contains hydrogen or halogen of at least 1atomic % or more as an agent for terminating dangling bonds. With respect to impurity elements contained in the film, each concentration of impurities for atmospheric constituents such as oxygen, nitrogen, and carbon is preferably set to be $1\times10^{20}$ atoms/cm$^3$ or less. In particular, the oxygen concentration is set to be $5\times10^{19}$ atoms/cm$^3$ or less, and preferably, $1\times10^{19}$ atoms/cm$^3$ or less. The field effect mobility μ of a TFT using the SAS is 1 to 10 cm$^2$/Vsec.

Moreover, the SAS may be further crystallized by laser irradiation.

Subsequently, an insulating film (hydrogenated film) 59 is formed by using silicon nitride so as to cover the gate electrode and the gate insulating layer 53. The insulating film (hydrogenated film) 59 is heated at 480° C. for 1 hour to activate the impurity element and hydrogenate the semiconductor layer 52.

Figure 7B:
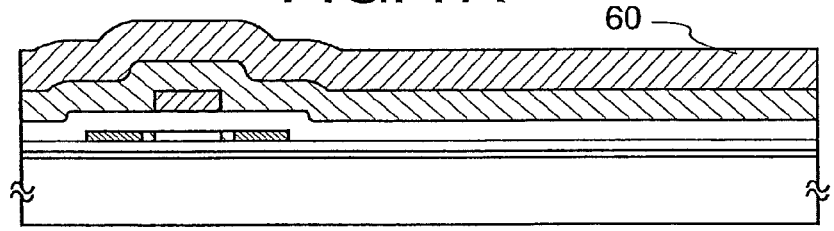

A first interlayer insulating layer 60 is formed to cover the insulating film (hydrogenated film) 59. As a material for forming the first interlayer insulating layer 60, silicon oxide, acrylic, polyimide, siloxane, a low-k material, and the like may be used. In this embodiment mode, a silicon oxide film is formed as the first interlayer insulating layer (FIG. 7B).

Figure 7C:
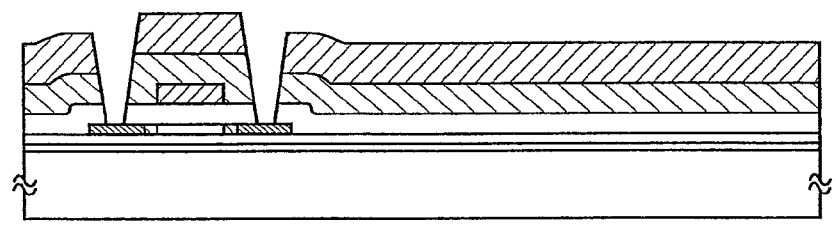

Next, contact holes that reach the semiconductor layer 52 are formed. The contact holes can be formed by etching to expose the semiconductor layer 52. The contact holes can be formed by either wet etching or dry etching. Further, they may be formed by etching one or more times depending on a condition. When etching is performed plural times, both wet etching and dry etching may be used (FIG. 7C).

Figure 7D:
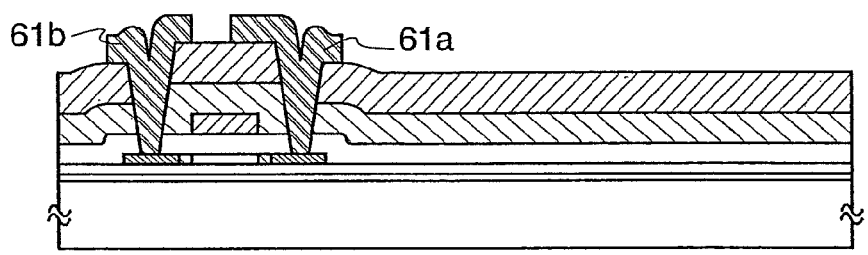

A conductive layer is formed to cover the contact holes and the first interlayer insulating layer 60. This conductive layer is processed into a desired shape to form a connection portion 61a, a wiring 61b, and the like. This wiring may have a single layer made from aluminum, copper, an aluminum-carbon-nickel alloy, an aluminum-carbon-molybdenum alloy, or the like. Further, the wiring may have a structure formed by laminating molybdenum, aluminum, and molybdenum from the side of a substrate, a structure formed by laminating titanium, aluminum, and titanium from the side of a substrate, or a structure formed by laminating titanium, titanium nitride, aluminum, and titanium from the side of a substrate (FIG. 7D).

Figure 7E:
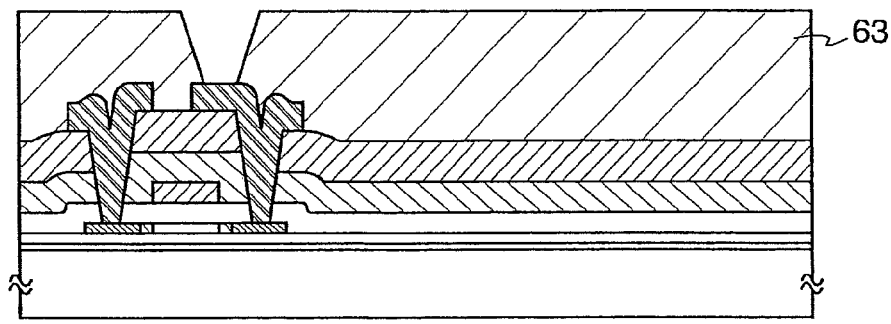

Thereafter, a second interlayer insulating layer 63 is formed to cover the connection portion 61a, the wiring 61b, and the first interlayer insulating layer 60. As a material of the second interlayer insulating layer 63, a coatable film having a self-planarizing property such as acrylic, polyimide, and siloxane is preferably used. In this embodiment mode, siloxane is used to form the second interlayer insulating layer 63 (FIG. 7E).

Subsequently, an insulating layer may be formed using silicon nitride or the like over the second interlayer insulating layer 63. This insulating layer is formed to prevent the second interlayer insulating layer 63 from being etched more than necessary in etching a pixel electrode that will be formed later. Therefore, when the ratio of the etching rates between the pixel electrode and the second interlayer insulating layer is large, this insulating layer may not be provided. Next, a contact hole is formed through the second interlayer insulating layer 63 to reach the connection portion 61a.

A conductive layer having a light transmitting property is formed to cover the contact hole and the second interlayer insulating layer 63 (or the insulating layer). Thereafter, the conductive layer having the light transmitting property is processed to form a first electrode 64 of a thin-film light emitting element. The first electrode 64 is electrically connected to the connection portion 61a.

The first electrode 64 can be formed by using a conductive film as shown in Embodiment Mode 1, for example, metal having a conducting property such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), and titanium (Ti); an alloy such as an aluminum-silicon (Al—Si) alloy, an aluminum-titanium (Al—Ti) alloy, and an aluminum-silicon-copper (Al—Si—Cu) alloy; nitride of a metal material such as titanium nitride (TiN); a metal compound such as indium tin oxide (ITO), ITO containing silicon, and indium zinc oxide (IZO) in which zinc oxide (ZnO) is mixed in indium oxide; and the like.

Figure 8A:
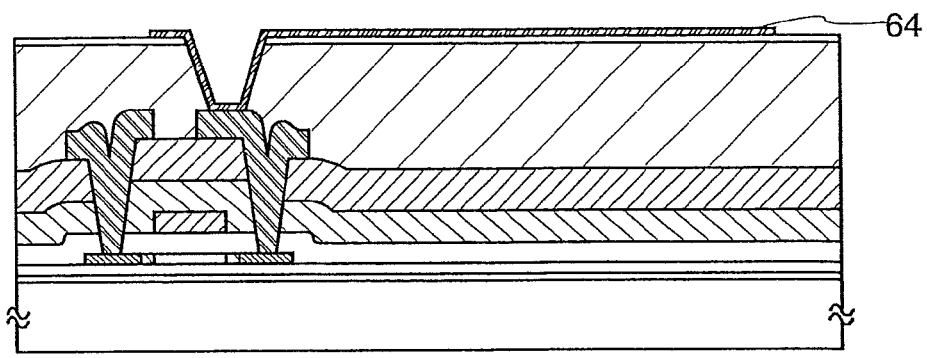
FIGS. 8A to 8C are cross sectional views explaining a method for manufacturing the active matrix light emitting device in accordance with the present invention.

An electrode through which light is emitted may be formed using a conductive film having a light transmitting property. For example, a metal compound such as ITO, ITSO, and IZO can be used. In addition, an extremely thin film of metal such as Al and Ag can be used. Further, in the case where light is emitted through a second electrode, the first electrode can be formed using a material having high reflectance (such as Al and Ag). In this embodiment mode, ITSO is used to form the first electrode 64 (FIG. 8A).

Figure 8B:
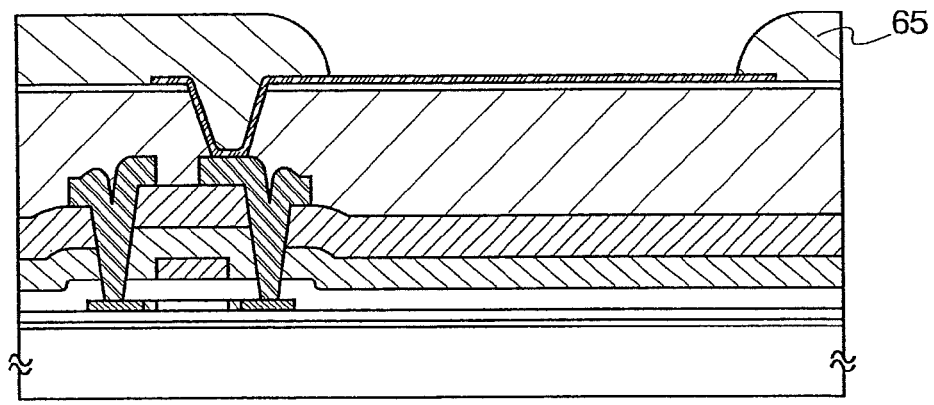
Figure 8C:
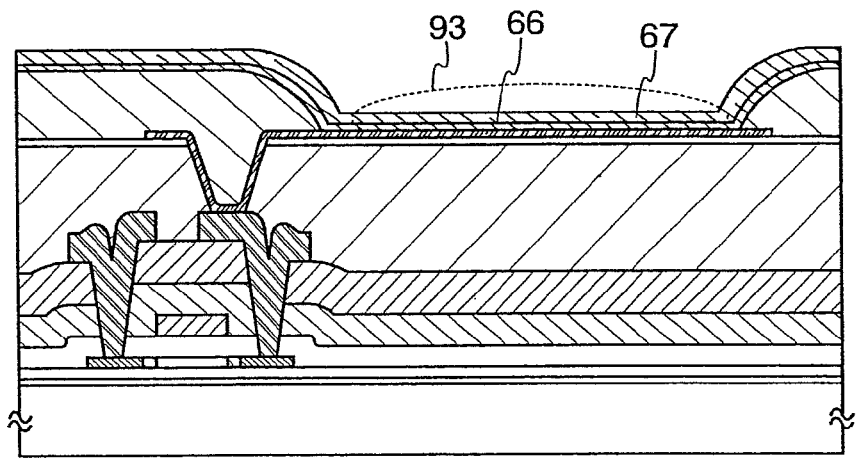

Next, an insulating layer is formed using an organic material or an inorganic material to cover the second interlayer insulating layer 63 (or the insulating layer) and the first electrode 64. Subsequently, the insulating layer is processed to expose a part of the first electrode 64 so as to form a partition wall 65. A photosensitive organic material (such as acrylic and polyimide) is preferably used as a material of the partition wall 65. In addition, the partition wall may be formed using a nonphotosensitive organic or inorganic material. Further, a black pigment such as carbon nitride or a dye may be dispersed in a material of the partition wall 65 by using a dispersant so that the partition wall 65 may be used as a black matrix. Preferably, an edge of the partition wall 65, where faces the first electrode, has a taper shape such that the curvature is continuously varied (FIG. 8B).

Subsequently, at least two or more light emitting bodies, and a conductive layer provided between the light emitting bodies are provided in accordance with any of Embodiment Modes 1 to 4. The numbers of light emitting bodies and conductive layers may be arbitrarily determined by an operator of the present invention. Numeral 66 denotes these bodies and layers as a whole.

A second electrode 67 is next formed. Thus, a light emitting element 93 including an layer containing a light emitting layer between the first electrode 64 and the second electrode 67 can be formed. By applying higher voltage to the first electrode than the second electrode, light emission can be obtained. As a material used for forming the second electrode 67, the same material as the first electrode can be used. In this embodiment mode, the second electrode is formed using aluminum.

Afterwards, a silicon oxide film containing nitrogen is formed as a passivation film by plasma CVD. When using a silicon oxide film containing nitrogen, a silicon oxynitride film may be formed using $SiH_4$, $N_2O$, and $NH_3$ by plasma CVD, or a silicon oxynitride film may be formed using $SiH_4$ and $N_2O$ by plasma CVD, or a silicon oxynitride film may be formed using a gas in which $SiH_4$ and $N_2O$ are diluted with Ar, by plasma CVD.

Alternatively, as the passivation film, a hydrogenated silicon oxynitride film formed using $SiH_4$, $N_2O$, and $H_2$ may be used. The passivation film is, of course, not limited to a single layer structure, and it may have a single layer structure or a laminated structure of other insulating layer containing silicon. In addition, a multilayer film including a carbon nitride film and a silicon nitride film, a multilayer film including styrene polymer, a silicon nitride film, or a diamond like carbon film may be formed instead of the silicon oxide film containing nitrogen.

Subsequently, to protect the light emitting element from a substance which promotes deterioration of the light emitting element such as moisture, a display portion is sealed. When the display portion is sealed with a counter substrate, the counter substrate is adhered to the display portion with an insulating sealing material such that an external connection portion is exposed. A space between the counter substrate and the element substrate may be filled with an inert gas such as dried nitrogen. Alternatively, a sealing material may be applied over the entire surface of the pixel portion and then the counter substrate may be attached thereto. An ultraviolet curing resin or the like is preferably used as the sealing material. A drying agent or a particle for maintaining a constant gap between the substrates may be mixed in the sealing material. Subsequently, a flexible wiring substrate is attached to the external connection portion. Thus, a light emitting device is completed.

Examples of structures of a light emitting device manufactured above will be described with reference to FIGS. 9A and 9B. Further, portions having similar functions are denoted by same reference numerals, though they may have different shapes so as to omit explanation. In this embodiment mode, the thin film transistor having an LDD structure is connected to the light emitting element through the connection portion.

Figure 9A:
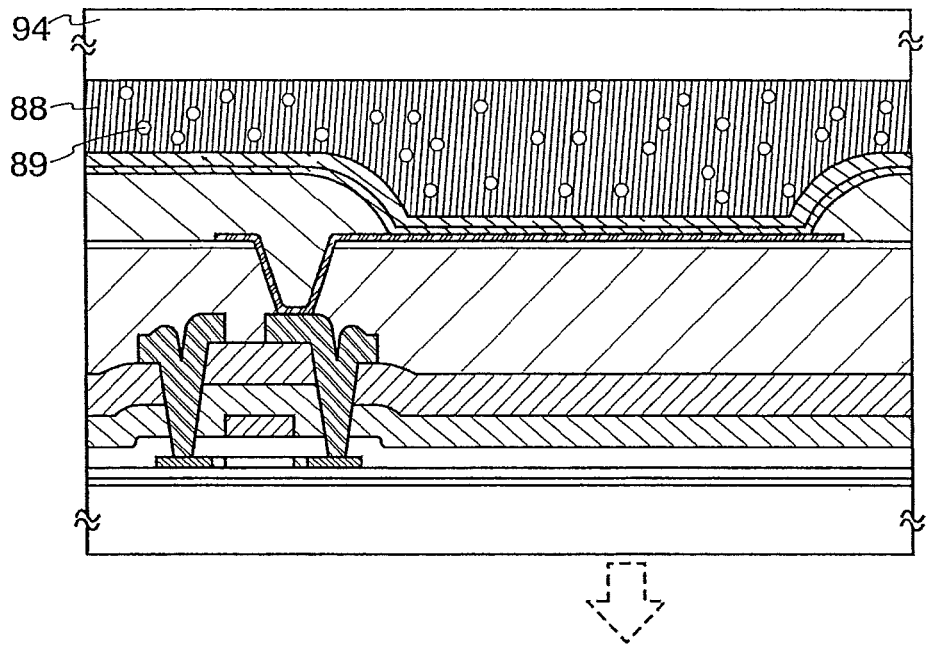
FIGS. 9A and 9B are cross sectional views of light emitting devices in accordance with the present invention.

FIG. 9A shows a structure where the first electrode is formed using a conductive film having a light transmitting property, and light generated in the light emitting body is emitted toward the substrate. Further, reference numeral 94 represents a counter substrate. After forming the light emitting element over the substrate, the counter substrate is firmly attached to the substrate using a sealing material or the like. A space between the counter substrate 94 and the light emitting element is filled with a resin 88 having a light transmitting property or the like to seal the light emitting element. Accordingly, the light emitting element can be prevented from being deteriorated by moisture or the like. Preferably, the resin 88 has a hygroscopic property. More preferably, to prevent the adverse influence of moisture, a drying agent 89 with a high light transmitting property is dispersed in the resin 88.

Figure 9B:
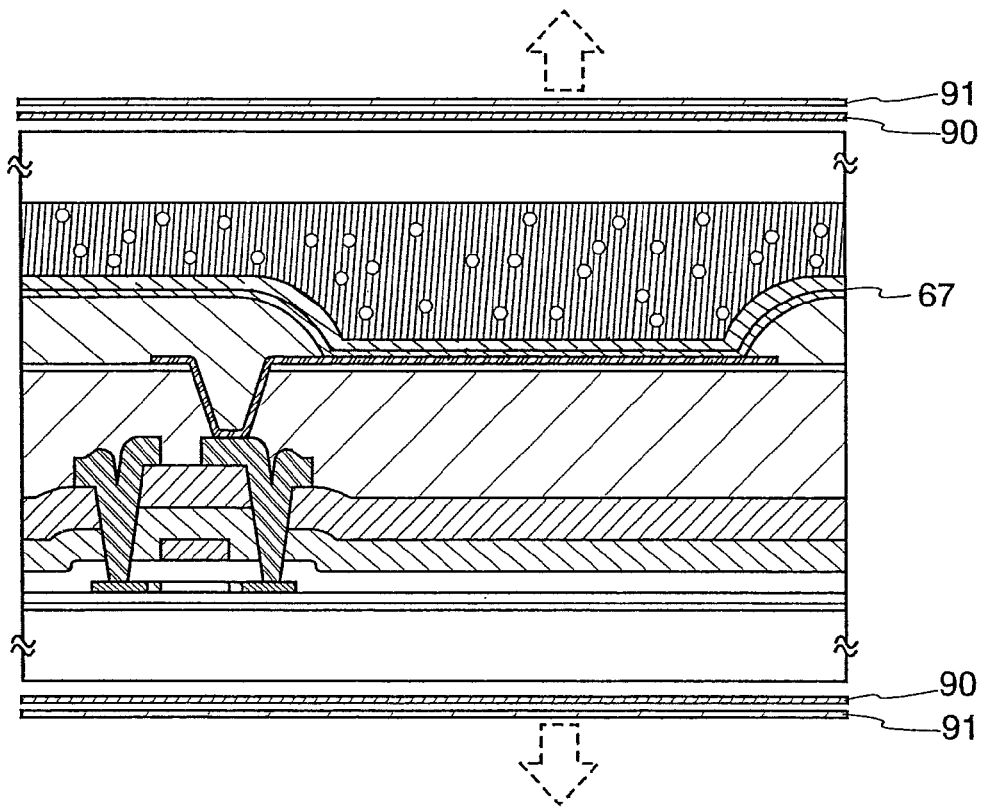

FIG. 9B shows a structure where both the first electrode and the second electrode 67 are formed using conductive films having light transmitting properties and light generated in the light emitting body can be emitted toward both the substrate and the counter substrate. In this structure, by providing polarizing plates 90 outside of the substrate and the counter substrate, a screen can be prevented from being transparent, thereby improving visibility. Protection films 91 may be provided outside of the polarizing plates 90.

A light emitting device having a display function in accordance with the present invention may employ either an analog video signal and a digital video signal. When a digital video signal is used, the video signal may use either a voltage or a current. When the light emitting element emits light, a video signal input to a pixel may have either a constant voltage or a constant current. When a video signal has a constant voltage, a constant voltage is applied to a light emitting element or a constant current flows through the light emitting element. Also, when a video signal has a constant current, a constant voltage is applied to a light emitting element or a constant current flows through the light emitting element. A driving method where a constant voltage is applied to a light emitting element is called a constant voltage drive. Meanwhile, a driving method where a constant current flows through a light emitting element is called a constant current drive. According to the constant current drive, constant current flows regardless of changes in resistance of a light emitting element. A light emitting device in accordance with the present invention and a driving method thereof may use the above mentioned methods.

A light emitting device of the present invention having such the structure has high light emitting efficiency along with high display quality.

The present embodiment mode can be implemented by freely combining with any of Embodiment Modes 1 to 7.

Embodiment Mode 8

In this embodiment mode, a method for manufacturing an active matrix light emitting device of the present invention will be described with reference to FIGS. 10A and 10B, FIGS. 11A and 11B, and FIG. 12. Further, materials for respective component parts are pursuant to Embodiment Modes 1 to 7, and will not be described here.

Figure 10A:
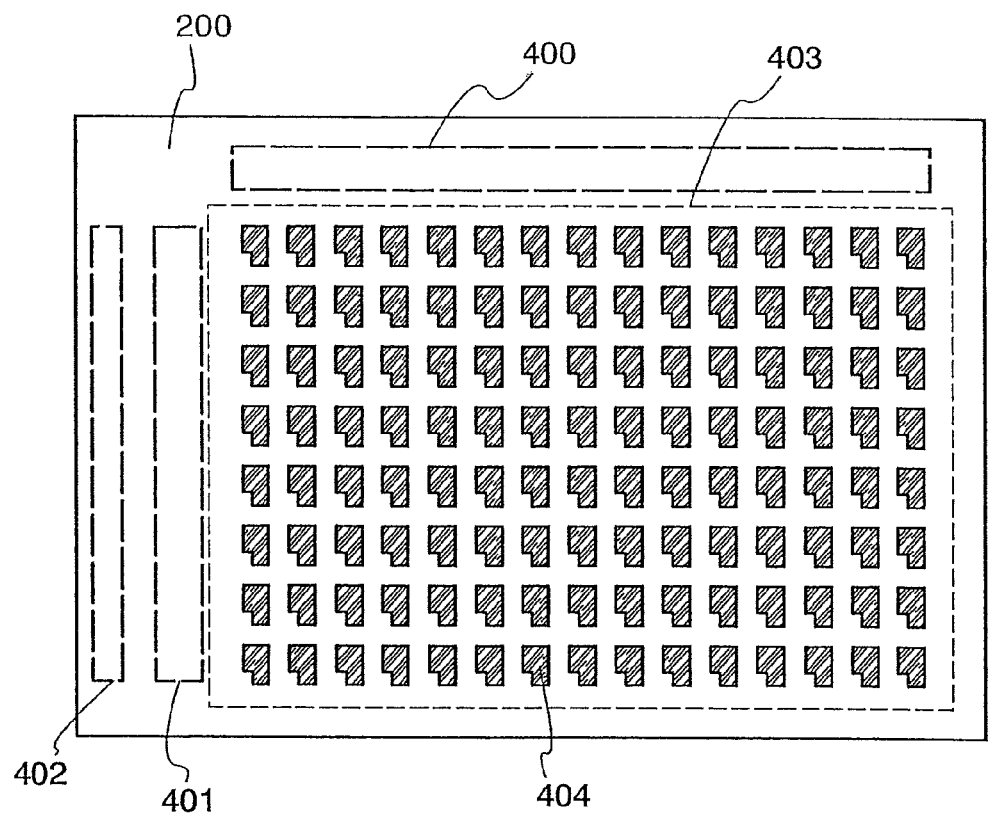
FIGS. 10A and 10B are top views explaining a method for manufacturing an active matrix light emitting device in accordance with the present invention.

FIG. 10A is a top view of a light emitting device in which component parts up to partition walls 65 are formed in accordance with Embodiment Mode 7. Dashed line portions provided over the substrate 200 respectively represent a scanning line driver circuit formation region 400, a signal line driver circuit formation region 401, an external connection portion formation region 402, and a pixel portion 403. Reference numeral 404 corresponds to opening portions of the partition walls 65 and shows a state in which the underlying first electrodes 205 are exposed through the opening portions. Reference numeral 404 also corresponds to light emitting regions. As shown in FIG. 10A, the light emitting regions 404 in which the first electrodes electrically connected to respective thin film transistors are partly exposed, are arranged in a matrix form.

Figure 10B:
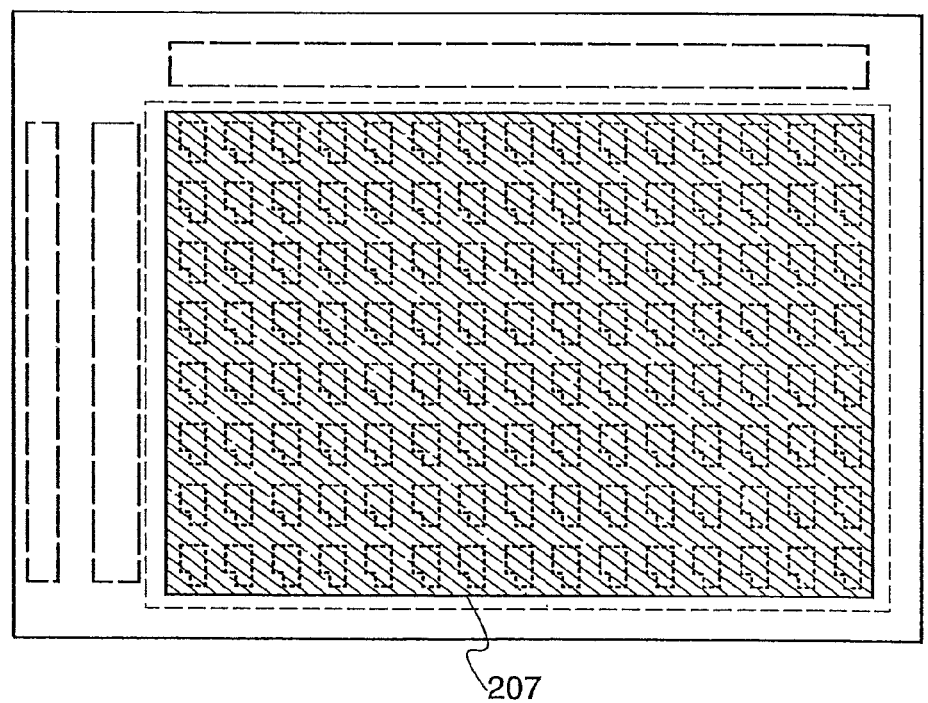

FIG. 10B shows a state in which a first light emitting body 207 is formed to cover the pixel portion 403. Although the first light emitting body 207 is formed over the entire surface of the pixel portion in this embodiment mode, light emitting bodies emitting different colors of light may be formed for each pixel or each certain region. Further, since the light emitting bodies have basically high resistance, there is no concern about cross talk between adjacent pixels.

Figure 11A:
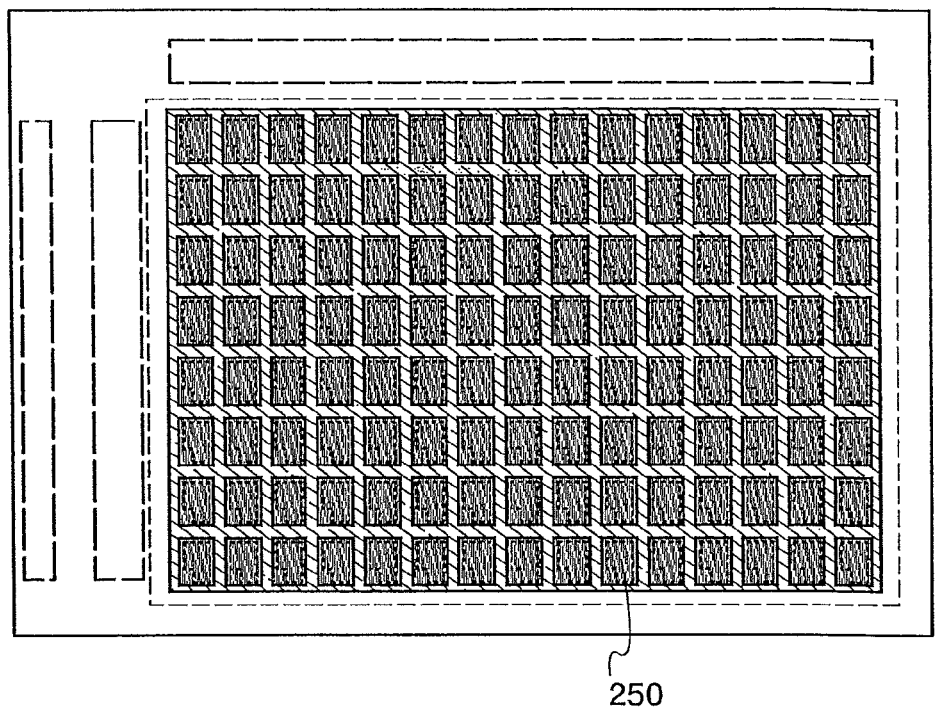
FIGS. 11A and 11B are top views explaining a method for manufacturing the active matrix light emitting device in accordance with the present invention.

FIG. 11A shows a state in which conductive layers 250 are provided such that they are isolated from one another for each pixel. Further, since an edge portion of each conductive layer 250 is provided outside of an edge portion of each light emitting region 404, even when slight misalignment of a mask is caused, each conductive layer 250 can cover each light emitting region 404. Therefore, deterioration in display quality is not caused, and failure caused by the misalignment of the mask can be reduced.

Figure 11B:
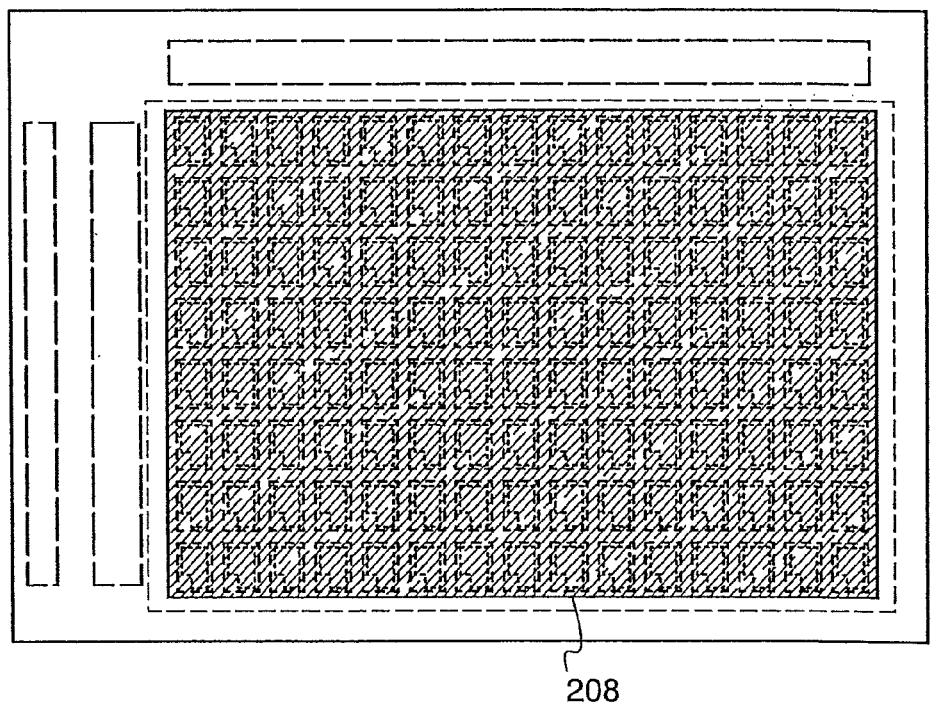

FIG. 11B shows a state in which a second light emitting body 208 is formed to cover the pixel portion 403. Thus, each edge portion of the conductive layers 250 can be covered with the first light emitting body 207 and the second light emitting body 208 so that the conductive layers 250 are isolated from one another for each pixel, thereby sufficiently reducing cross talk caused between adjacent pixels. Consequently, it is possible to obtain a light emitting device having high light emitting efficiency along with high display quality, wherein light is emitted from the first and second light emitting bodies 207 and 208, and cross talk between adjacent pixels is sufficiently reduced.

Figure 12:
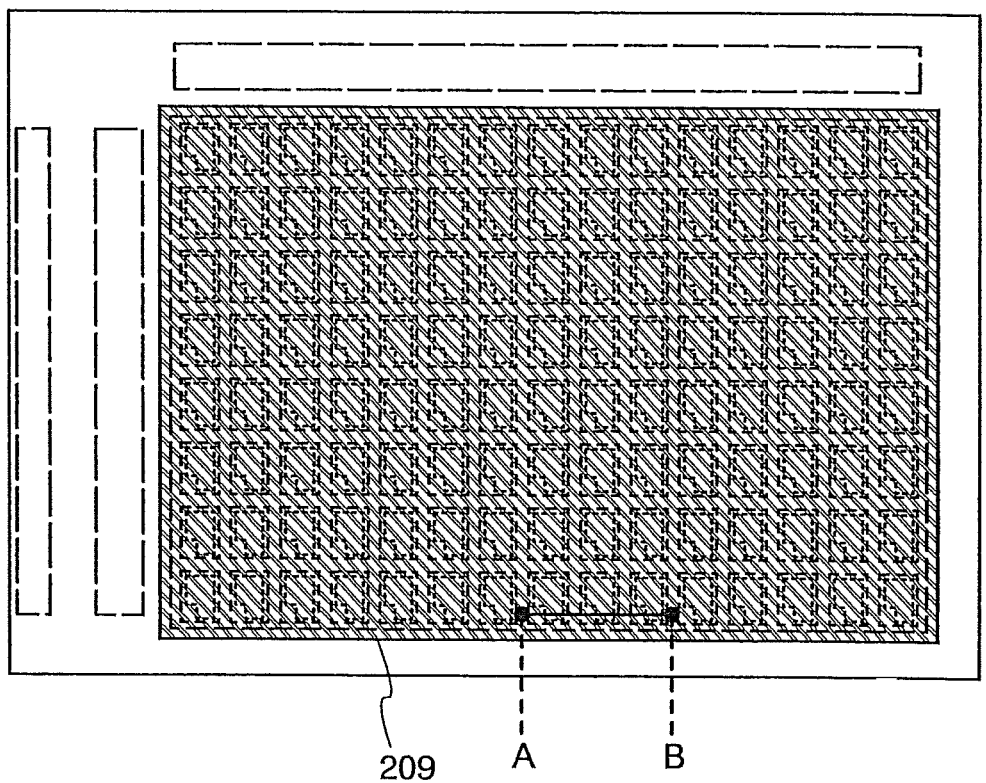
FIG. 12 is a top view explaining a method for manufacturing the active matrix light emitting device in accordance with the present invention.

FIG. 12 shows a state in which component parts up to a second electrode 209 are formed. The second electrode 209 may be formed across the pixels. Further, a cross section along a line A-B of FIG. 12 corresponds to the cross sectional views of the active matrix light emitting devices described in Embodiment Modes 1 through 4.

This embodiment mode can be implemented by freely combining with Embodiment Modes 1 through 8.

Embodiment Mode 9

Figure 13A:
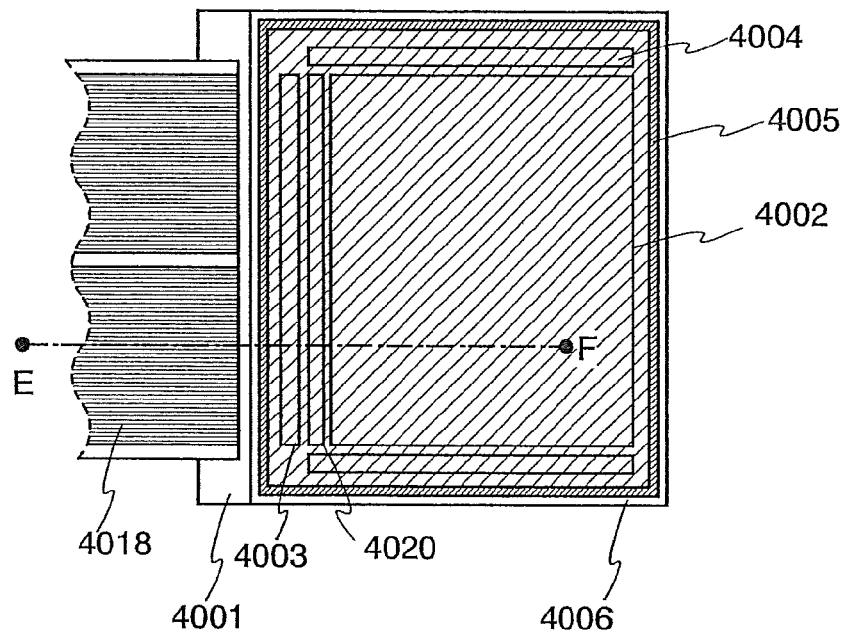
FIG. 13A is a top view and FIG. 13B is a cross sectional view of a light emitting device in accordance with the present invention.
Figure 13B:
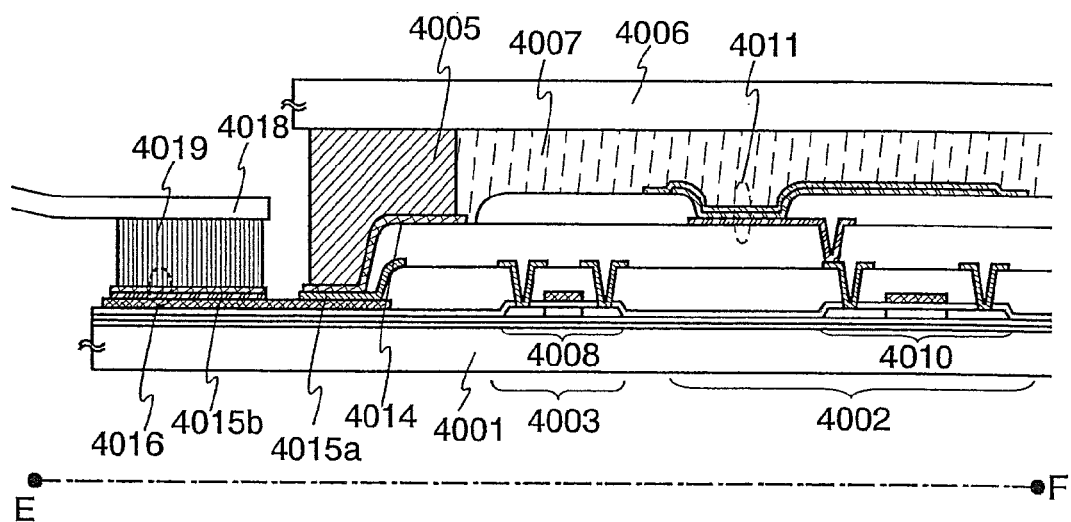

An outer appearance of a panel which is a light emitting device of the present invention, will be described in this embodiment mode with reference to FIGS. 13A and 13B. FIG. 13A is a top view of a panel in which a transistor and a light emitting element formed over a substrate are sealed with a sealing material that is formed between the substrate and a counter substrate 4006. FIG. 13B is a cross sectional view of E-F line FIG. 13A. The light emitting element mounted on this panel has a structure as shown in Embodiment Mode 4.

A sealing material 4005 is provided so as to surround a pixel portion 4002, a signal line driver circuit 4003, and a scanning line driver circuit 4004 that are provided over a substrate 4001. The counter substrate 4006 is provided over the pixel portion 4002, the signal line driver circuit 4003, and the scanning line driver circuit 4004. Thus, the pixel portion 4002, the signal line driver circuit 4003, and the scanning line driver circuit 4004 are hermetically sealed with the substrate 4001, the sealing material 4005, and the counter substrate 4006 along with a filler 4007.

The pixel portion 4002, the signal line driver circuit 4003, and the scanning line driver circuit 4004, which are provided over the substrate 4001, have a plurality of transistors. In FIG. 13B, a thin film transistor 4008 included in the signal line driver circuit 4003 and a thin film transistor 4010 included in the pixel portion 4002 are shown.

Further, a light emitting element 4011 is electrically connected to the thin film transistor 4010.

Also, a leading wiring 4014 corresponds to a wiring for supplying signals or power supply voltage to the pixel portion 4002, the signal line driver circuit 4003, and the scanning line driver circuit 4004. The leading wiring 4014 is connected to a connection terminal 4016 through a leading wiring 4015a and a leading wiring 4015b. The connection terminal 4016 is electrically connected to a terminal of a flexible printed circuit (FPC) 4018 through an anisotropic conductive film 4019.

Further, as the filler 4007, an ultraviolet curing resin or a heat curing resin can be used in addition to an inert gas such as nitrogen and argon. For example, polyvinyl chloride, acrylic, polyimide, an epoxy resin, a silicon resin, polyvinyl butyral, or ethylene vinylene acetate can be used.

Furthermore, the light emitting device of the present invention includes a panel in which a pixel portion having a light emitting element is formed and a module in which an IC is mounted on the panel.

The light emitting device of the present invention has high light emitting efficiency along with high display quality.

The present embodiment mode can be implemented by freely combining with Embodiment Mode 1 through 9.

Embodiment Mode 10

Pixel circuits and protection circuits included in the panel and module described in Embodiment Mode 9, and operations thereof will be described in this embodiment mode. Further, the cross sectional views as shown in FIGS. 7A to 7E and FIGS. 8A to 8C correspond to cross sectional views of a driving TFT 1403 and a light emitting element 1405.

Figure 14A:
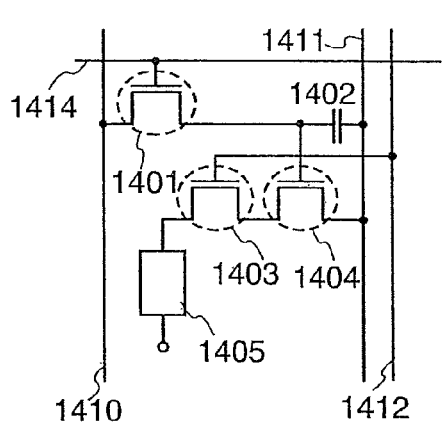
FIGS. 14A to 14F are diagrams showing examples of pixel circuits for light emitting devices in accordance with the present invention.

In a pixel as shown in FIG. 14A, a signal line 1410, power supply lines 1411 and 1412 are arranged in columns, whereas a scanning line 1414 is arranged in a row. The pixel also includes a switching TFT 1401, a driving TFT 1403, a current controlling TFT 1404, a capacitor element 1402, and a light emitting element 1405.

Figure 14B:
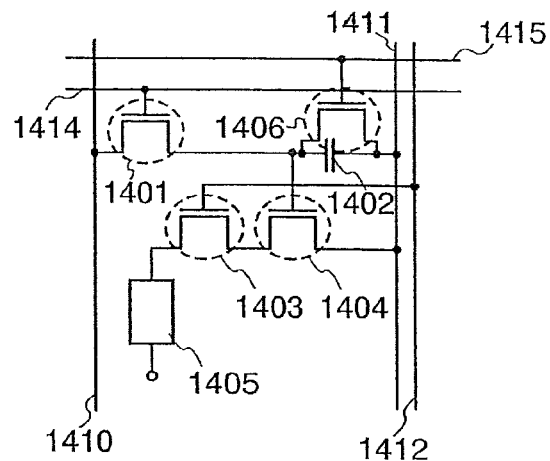
Figure 14C:
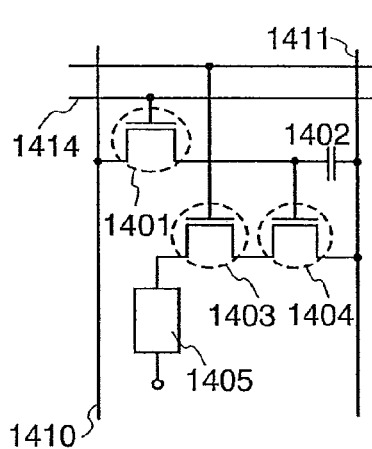

A pixel as shown in FIG. 14C has a similar structure to the one shown in FIG. 14A, except that a gate electrode of the driving TFT 1403 is connected to a power supply line 1412 that is arranged in a row. That is, both pixels depicted in FIGS. 14A and 14C show similar equivalent circuit diagrams. However, respective power supply lines are formed of conductive films in different layers between the case where the power supply line 1412 is arranged in a column (FIG. 14A) and the case where the power supply line 1412 is arranged in a row (FIG. 14C). In order to emphasis on the different arrangements of the power supply lines to which the gate electrodes of the driving TFTs 1403 are connected, the equivalent circuit diagrams are individually illustrated in FIGS. 14A and 14C.

In each pixel as shown in FIGS. 14A and 14C, the driving TFT 1403 and the current controlling TFT 1404 are connected in series in each pixel, and the channel length L(1403) and the channel width W(1403) of the driving TFT 1403 and the channel length L(1404) and the channel width W(1404) of the current controlling TFT 1404 may be set to satisfy the relation of L(1403)/W(1403):L(1404)/W(1404)=5 to 6,000:1.

The driving TFT 1403 is operated in a saturation region and controls the amount of current flowing through the light emitting element 1405, whereas the current controlling TFT 1404 is operated in a linear region and controls current supplied to the light emitting element 1405. The both TFTs 1403 and 1404 preferably have a same conductivity type in view of the manufacturing process, and n-channel TFTs are formed as the TFTs 1403 and 1404 in this embodiment mode. Also, a depletion type TFT may be used as the driving TFT 1403 instead of an enhancement type TFT. In a light emitting device of the present invention having the above structure, slight variations in $V_{gs}$ of the current controlling TFT 1404 does not adversely affect the amount of current flowing through the light emitting element 1405, since the current controlling TFT 1404 is operated in the linear region. That is, the amount of current flowing through the light emitting element 1405 can be determined by the driving TFT 1403 operated in the saturation region. In accordance with the above described structure, it is possible to provide a light emitting device in which image quality is improved by improving variations in luminance of a light emitting element due to variation of the TFT characteristics.

The switching TFT 1401 of each pixel as shown in FIGS. 14A to 14D controls a video signal input with respect to the pixel. When the switching TFT 1401 is turned on and a video signal is input in the pixel, a voltage of the video signal is held in the capacitor element 1402. Although the arrangement in which each pixel includes the capacitor element 1402 are shown in FIGS. 14A and 14C, the present invention is not limited thereto. When a gate capacitor or the like can serve as a capacitor for holding a video signal, the capacitor element 1402 may not be provided.

Figure 14D:
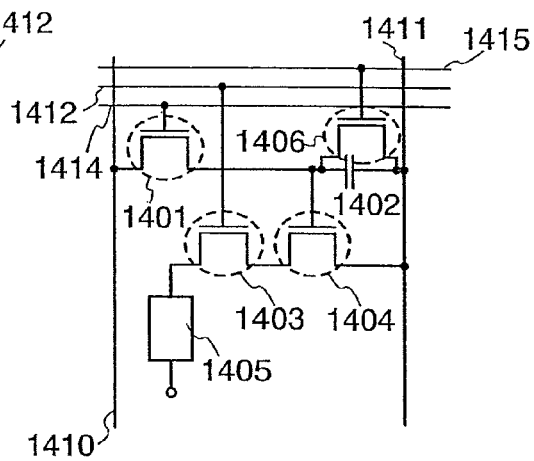

A pixel as shown in FIG. 14B has a similar structure to the one shown in FIG. 14A, except that a TFT 1406 and a scanning line 1415 are added thereto. Similarly, a pixel as shown in FIG. 14D has a similar structure to the one shown in FIG. 14C, except that a TFT 1406 and a scanning line 1415 are added thereto.

The TFT 1406 is controlled to be turned on/off by the newly provided scanning line 1415. When the TFT 1406 is turned on, the charge held in the capacitor element 1402 is discharged, thereby turning the current controlling TFT 1404 off. That is, supply of current flowing through the light emitting element 1405 can be forcibly stopped by providing the TFT 1406. Therefore, the TFT 1406 can also referred to as an erasing TFT. A lighting period can start simultaneously with or immediately after a writing period starts before signals are written into all the pixels in accordance with the structures shown in FIGS. 14B and 14D, and hence, the duty ratio can be improved.

Figure 14E:
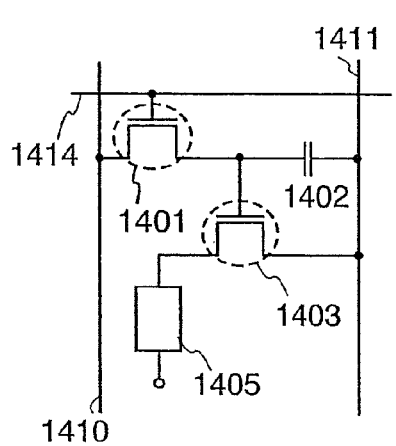
Figure 14F:
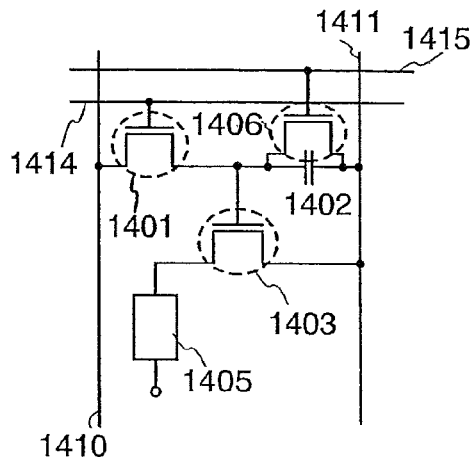

In a pixel as shown in FIG. 14E, a signal line 1410 and a power supply line 1411 are arranged in columns while a scanning line 1414 is arranged in a row. The pixel further includes a switching TFT 1401, a driving TFT 1403, a capacitor element 1402, and a light emitting element 1405. A pixel shown in FIG. 14F has a similar structure to the one shown in FIG. 14E, except that a TFT 1406 and a scanning line 1415 are added thereto. Further, the structure as shown in FIG. 14F also allows a duty ratio to be improved by providing the TFT 1406.

Figure 21:
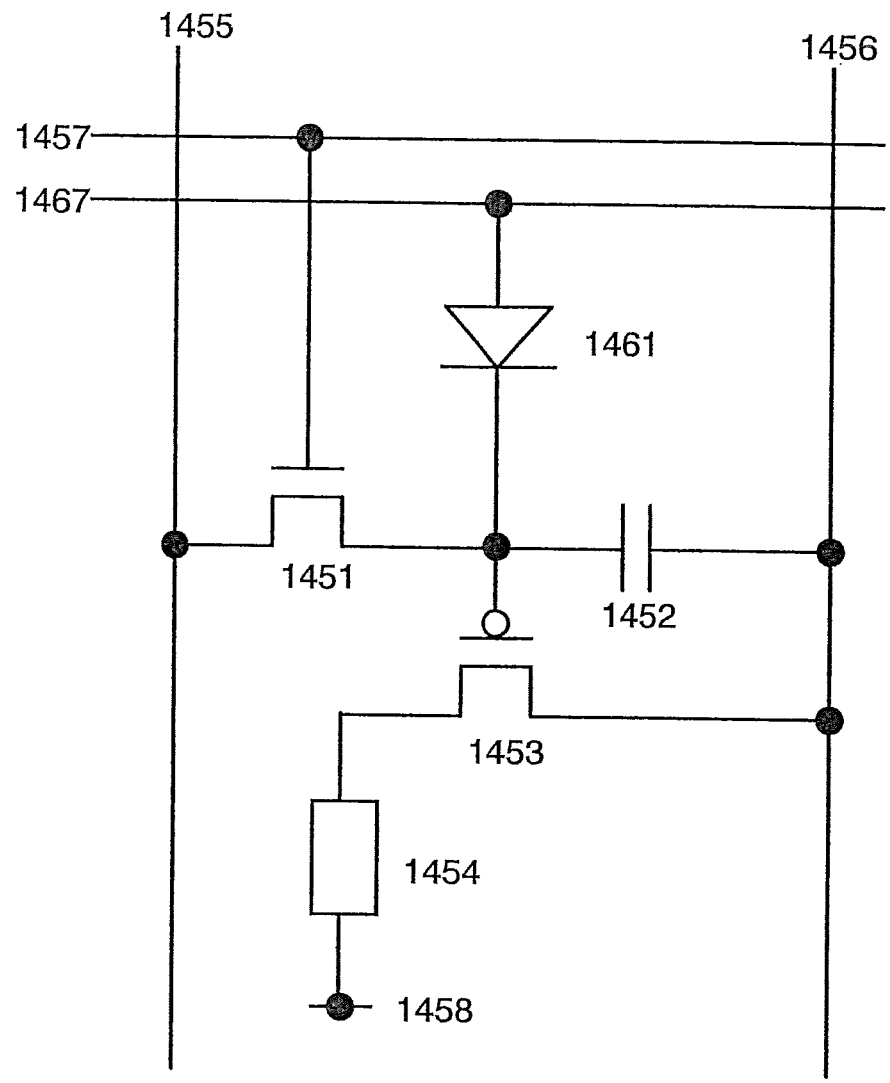
FIG. 21 is a diagram showing an example of a pixel circuit for a light emitting device in accordance with the present invention.

A structural example of a pixel in the case where the deriving TFT 1403 is forcibly turned off will be shown in FIG. 21. In FIG. 21, a selecting TFT 1451, a driving TFT 1453, an erasing diode 1461, and a light emitting element 1454 are arranged. A source and a drain of the selecting TFT 1451 are respectively connected to a signal line 1455 and a gate of the driving TFT 1453. A gate of the selecting TFT 1451 is connected to a first gate line 1457. A source and a drain of the driving TFT 1453 are respectively connected to a first power line 1456 and the light emitting element 1454. The erasing diode 1461 is connected to a gate of the driving TFT 1453 and a second gate line 1467.

A capacitor element 1452 serves to hold gate potential of the driving TFT 1453. Therefore, the capacitor element 1452 is connected between the gate of the driving TFT 1453 and the power line 1456. However, the present invention is not limited to this structure, and the capacitor element may be arranged such that it can hold gate potential of the driving TFT 1453. Further, when gate potential of the driving TFT 1453 is held by using a gate capacitor of the driving TFT 1453, the capacitor element 1452 may be eliminated.

As the driving method, the first gate line 1457 is selected and the selecting TFT 1451 is turned on. When a signal is input in the capacitor element 1452 from the signal line 1455, current of the driving TFT 1453 is controlled in accordance with the signal, and current flows into a second power line 1458 through the light emitting element 1454 from the first power line 1456.

In order to erase a signal, the second gate line 1467 is selected (in this case, potential of the second gate line is increased), and the erasing diode 1461 is turned on so as to feed current to the gate of the driving TFT 1453 from the second gate line 1467. As a result, the driving TFT 1453 becomes an off state. Thus, current does not flow into the second power line 1458 from the first power line 1456 through the light emitting element 1454. Consequently, a non-light emitting period can be made, thereby freely adjusting a light emitting period.

In order to hold a signal, the second gate line 1467 is not selected (in this case, potential of the second gate line is reduced). Thus, the erasing diode 1461 is turned off so that gate potential of the driving TFT 1453 is held.

Further, the erasing diode 1461 is not particularly limited so long as it is an element having a rectifying property. Either a PN-type diode or a PIN-type diode may be used. Alternatively, either a Schottky diode or a zener diode may be used.

As described above, various kinds of pixel circuits can be employed. In particular, when a thin film transistor is formed using an amorphous semiconductor film, an area of a semiconductor film of each of the driving TFTs 1403 and 1453 is preferably made large. Therefore, in the above pixel circuits, a top emission type in which light generated in the light emitting body is emitted through a sealing substrate, is preferably employed.

It is thought that such an active matrix light emitting device is preferable when pixel density is increased since a TFT is provided for each pixel.

An active matrix light emitting device in which a TFT is provided in each pixel is described in this embodiment mode. However, a passive matrix light emitting device in which a TFT is provided for each column can be formed. Since a TFT is not provided in each pixel in the passive matrix light emitting device, high aperture ratio is obtained. In the case of a light emitting device in which light generated in a light emitting body is emitted toward both sides of the light emitting body, when a passive matrix light emitting device is employed, transmittance can be increased.

Subsequently, a case in which diodes are provided as protection circuits in a scanning line and a signal line, will be described using an equivalent circuit diagram shown in FIG. 14E.

Figure 15:
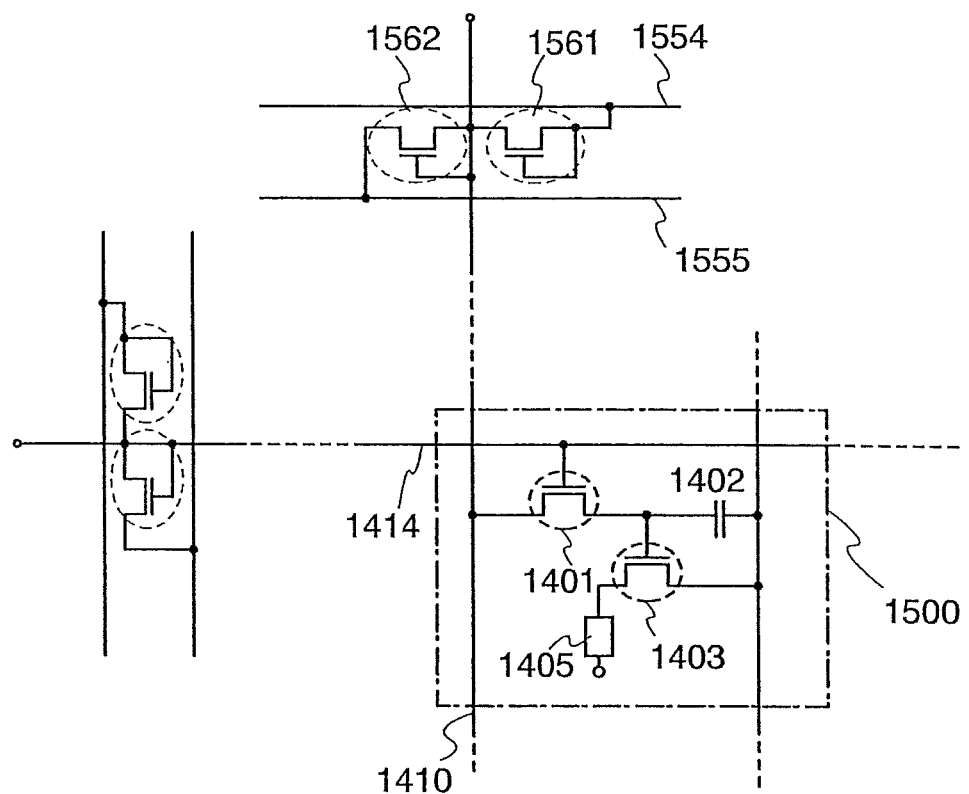
FIG. 15 is a diagram showing an example of a protection circuit for a light emitting device in accordance with the present invention.

In FIG. 15, a switching TFT 1401 and the driving TFT 1403, a capacitor element 1402, and a light emitting element 1405 are provided in a pixel portion 1500. In the signal line 1410, diodes 1561 and 1562 are provided. The diodes 1561 and 1562 are manufactured in accordance with the above described embodiment mode as well as the switching TFT 1401 and the driving TFT 1403. Each diode includes a gate electrode, a semiconductor layer, a source electrode, a drain electrode, and the like. By connecting the gate electrode to the drain electrode or the source electrode, the diodes 1561 and 1562 are operated.

Common potential lines 1554 and 1555 connecting to the diodes are formed in the same layer as the gate electrodes. Therefore, it is necessary to form contact holes in a gate insulating layer so as to be in contact with the source electrodes or the drain electrodes of the diodes.

A diode provided in the scanning line 1414 has the similar structure.

As mentioned above, protection diodes can be simultaneously formed in an input stage according to the present invention. Further, the positions of the protection diodes are not limited to FIG. 15, and they can be provided between a driver circuit and a pixel.

A light emitting device of the present invention including such protection circuits has high light emitting efficiency along with high display quality. Further, the reliability of the light emitting device can be further improved.

Embodiment Mode 11

In this embodiment mode, a method for manufacturing a passive matrix light emitting device of the present invention will be described with reference to FIGS. 16A and 16B, FIGS. 17A and 17B, and FIGS. 18A and 18B. Further, materials and the like for respective component parts are pursuant to those of Embodiment Modes 1 through 4, and explanation thereof sometimes will be omitted.

First, first electrodes 301 extending in on direction and terminals 500 for forming input terminal portions are formed over a main surface of a substrate 300 by using a same material. A composition of the first electrodes 301 and a method for manufacturing thereof are described above. The substrate 300 can be formed using, for example, a glass substrate such as barium borosilicate glass and alumino borosilicate glass, a quartz substrate, or the like. Further, since light emitting elements in which light is emitted through the first electrodes 301, are used in FIG. 16A, the substrate 300 is formed using a material having a light transmitting property. However, when light is emitted through second electrodes 305, the substrate 300 may be formed using a metal substrate such as a stainless steel substrate, a silicon substrate having a surface on which an insulating film is formed, a ceramic substrate, or the like, in addition to the above mentioned substrates. A flexible substrate made from a synthetic resin such as plastic tends to have a lower heat resistance property as compared to the above mentioned substrates, however, when the flexible substrate can withstand a processing temperature of a manufacturing process, the flexible substrate can be used as the substrate 300.

Figure 16A:
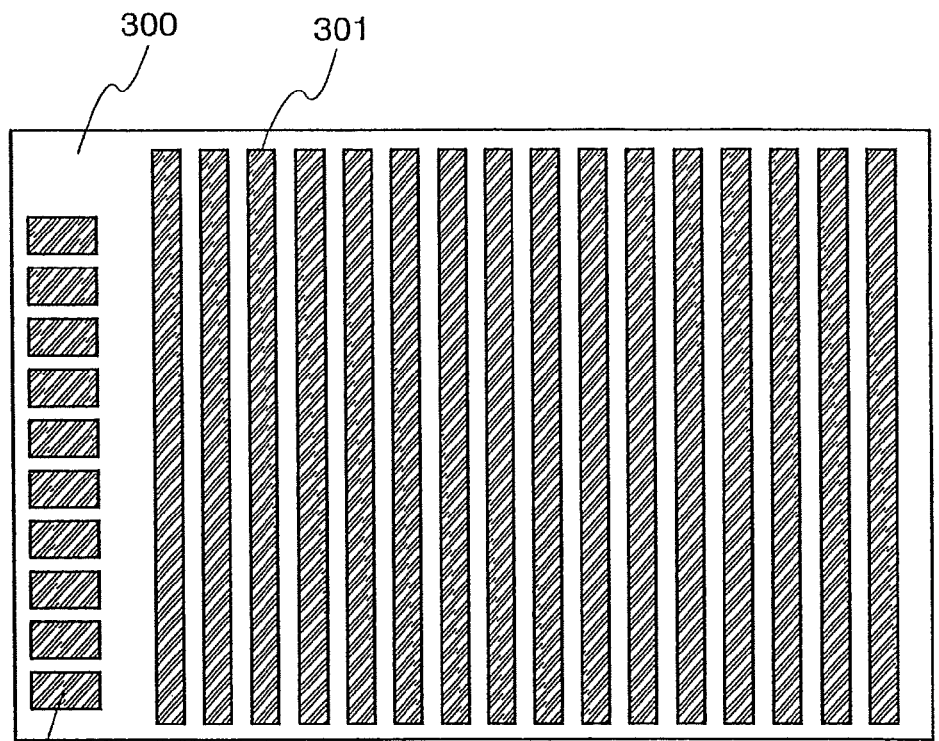
FIGS. 16A and 16B are top views explaining a method for manufacturing a passive matrix light emitting device in accordance with the present invention.
Figure 16B:
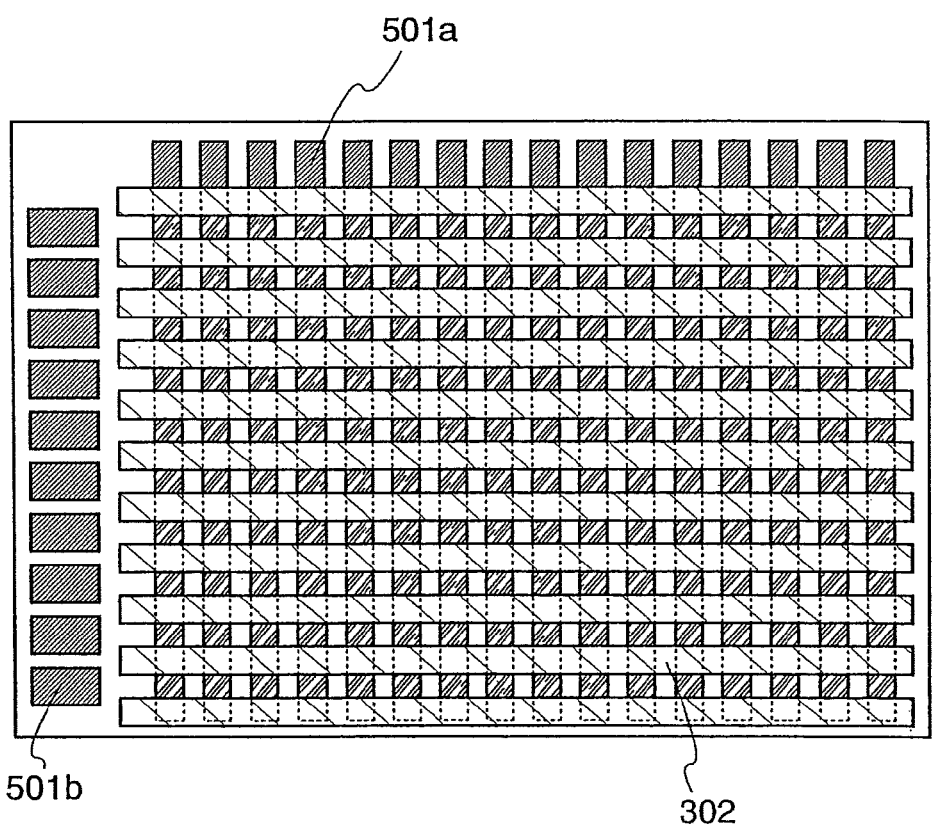

Next, as shown in FIG. 16B, auxiliary electrodes 501a and auxiliary electrodes 501b are formed in formation regions of input terminal portions of the first electrodes 301 and formation regions of connection portions/input terminal portions of the second electrodes. The auxiliary electrodes are preferably formed using a conductive material having an excellent heat sealing property in a case of being connected to an external circuit, and are preferably formed using a metal material containing chromium, nickel, or the like. Next, partition walls 302 are formed. The partition walls 302 are provided to be orthogonal to the first electrodes 301. The partition walls 302 can be formed using silicon oxide, silicon nitride, silicon oxynitride, aluminum oxide, aluminum nitride, aluminum oxynitride, other inorganic material having an insulating property; acrylic acid, methacryl acid, or a derivative thereof; a polymer material having a heat resistance property such as polyimide, aromatic polyamide, and polybenzoimidazole; or siloxane.

Figure 17A:
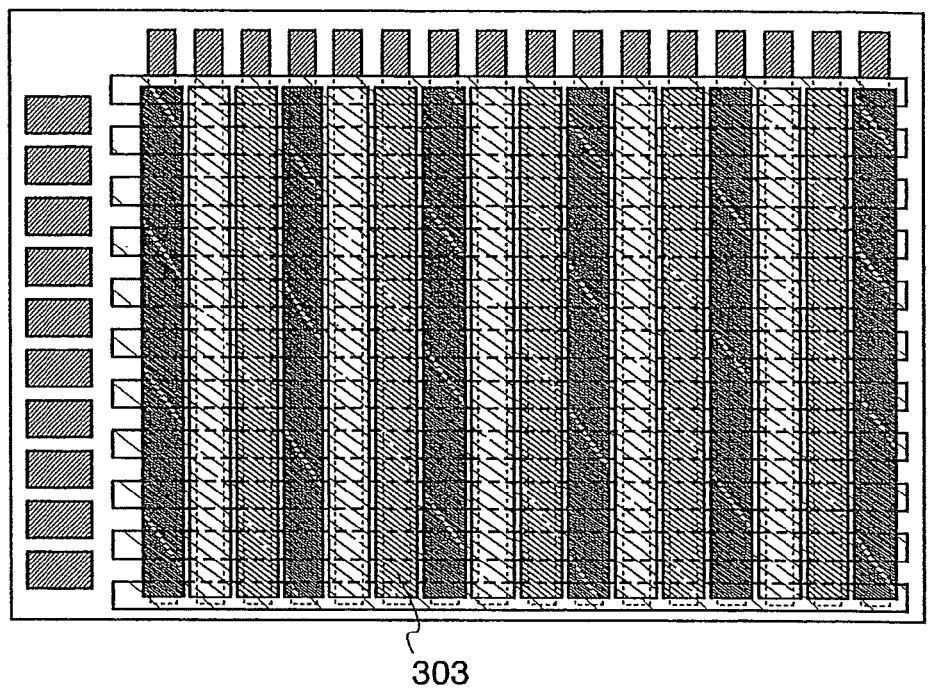
FIGS. 17A and 17B are top views explaining a method for manufacturing the passive matrix light emitting device in accordance with the present invention.

Thereafter, as shown in FIG. 17A, first light emitting bodies 303 are formed over the first electrodes 301 which are exposed through the partition walls 302. In this embodiment mode, as the first light emitting bodies 303, three kinds of light emitting bodies including different light emitting materials which emit different colors of light, are formed alternately. Of course, the same kind of light emitting bodies may be formed in all pixels. Further, in light emitting regions of this embodiment mode, the first electrodes 301 are exposed through the partition walls 302.

Figure 17B:
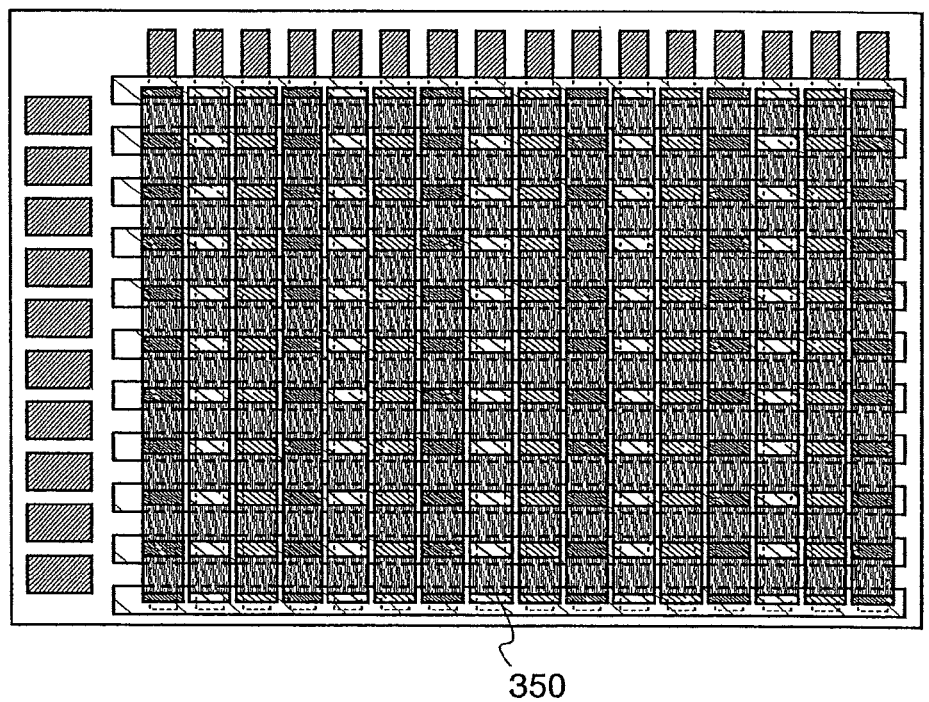

Subsequently, as shown in FIG. 17B, conductive layers 350 are formed for each pixel such that they are isolated from one another. Further, each edge portion of the conductive layers is provided outside of each edge portion of the light emitting regions. Thus, even when slight misalignment of a mask is caused, the conductive layers 350 can cover the light emitting regions, thereby preventing deterioration in display quality. Further, failure caused by the misalignment of the mask can be reduced.

Figure 18A:
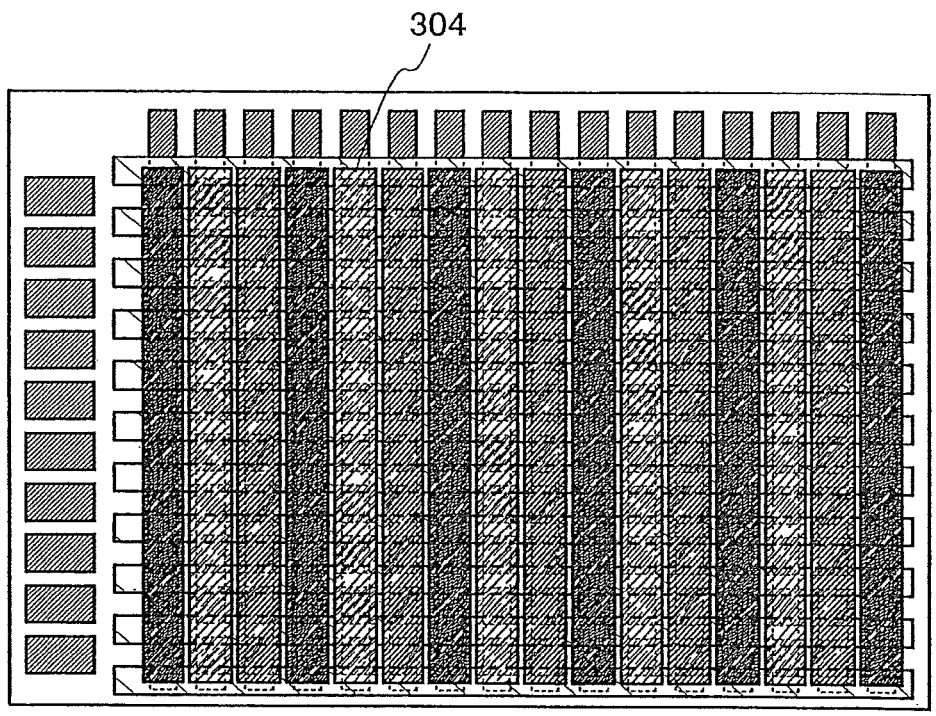
FIGS. 18A and 18B are top views explaining a method for manufacturing the passive matrix light emitting device in accordance with the present invention.

Next, as shown in FIG. 18A, second light emitting bodies 304 are formed over the conductive layers 350. In the same manner as the first light emitting bodies 303, three kinds of light emitting bodies including different light emitting materials which emit different colors of light, are alternately formed as the second light emitting bodies 304. Accordingly, each edge portion of the conductive layers 350 can be covered with the first light emitting bodies 303 and the second light emitting bodies 304. Since the conductive layers 350 are isolated from one another for each pixel, cross talk caused between adjacent pixels can be sufficiently reduced. Consequently, it is possible to obtain a light emitting device having high light emitting efficiency along with high display quality, wherein light is emitted from the first and second light emitting bodies 303 and 304, and cross talk between adjacent pixels is sufficiently reduced.

Figure 18B:
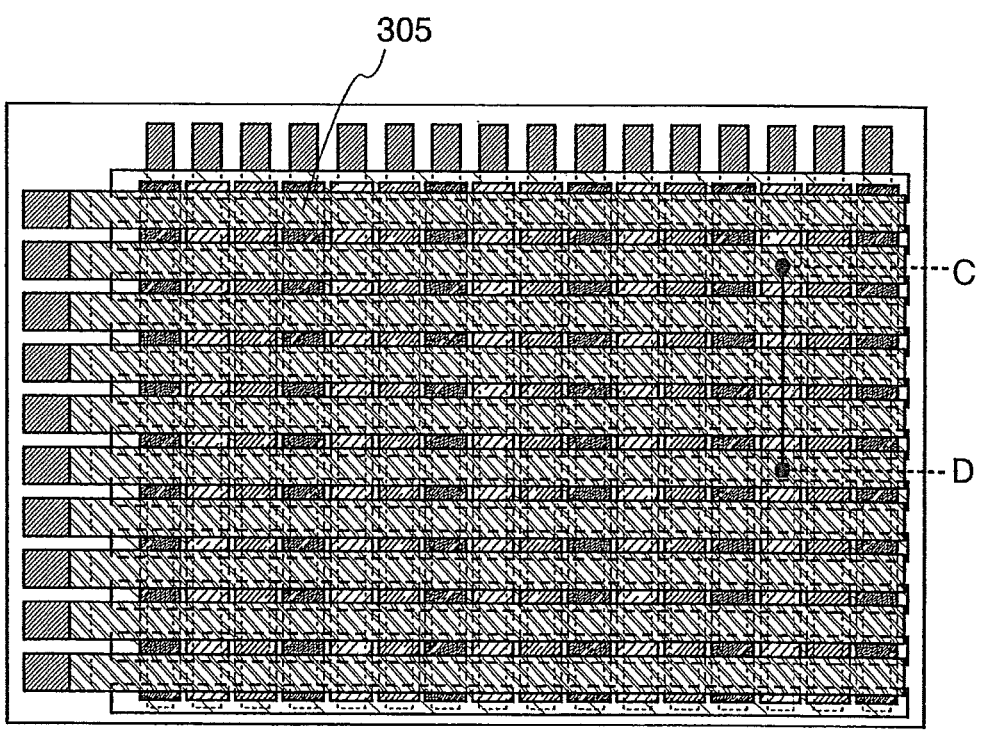

Subsequently, as shown in FIG. 18B, second electrodes 305 extending in a direction orthogonal to the first electrodes 301, are formed in regions in which first light emitting bodies 303, the conductive layers 350, and the second light emitting bodies 304 are formed over the first electrode 301.

As set forth above, a panel having a pixel portion in which light emitting elements are formed, is obtained. Further, a cross section along a line C-D of FIG. 18 corresponds to the cross sectional views of the passive matrix light emitting device shown in Embodiment Modes 1 through 4.

Figure 19A:
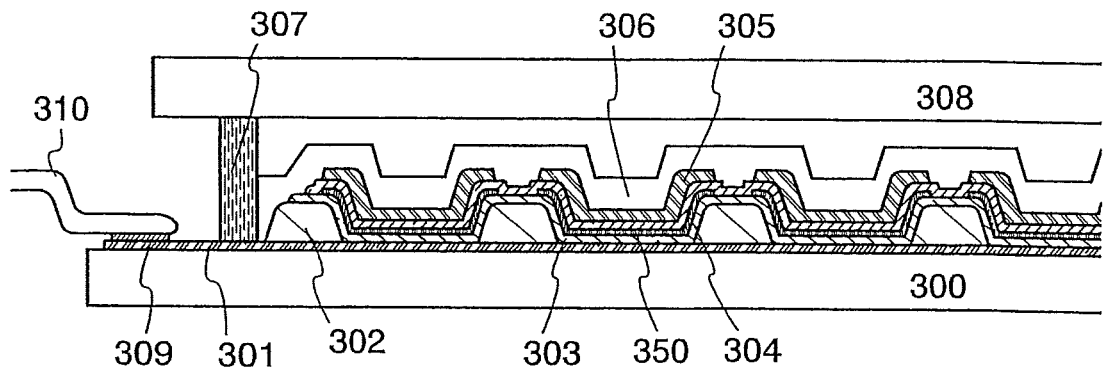
FIG. 19A is a cross sectional view and FIG. 19B is a top view of a light emitting device in accordance with the present invention.

Afterwards, as shown in FIG. 19A, a protection film 306 is formed to prevent intrusion of moisture and the like. A sealing substrate 308 made from glass, quartz, a ceramic material such as alumina, or a synthetic material is firmly attached to the substrate 300 with an adhesive agent 307. Further, external input terminal portions are connected to an external circuit by using a flexible printed wiring substrate 310 through an anisotropic conductive film 309. The protection film 306 is formed using silicon nitride. In addition to silicon nitride, the protection film 306 may be formed using a laminated body of carbon nitride and silicon nitride so as to reduce stress and increase a gas barrier property.

Figure 19B:
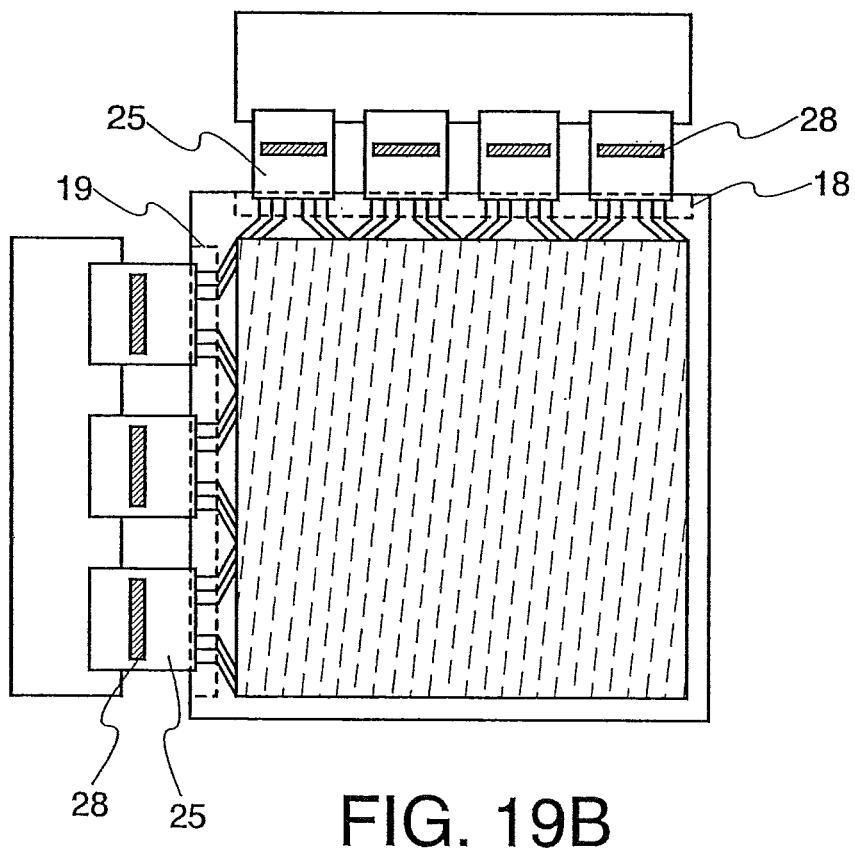

FIG. 19B shows a state of a module in which an external circuit is connected to the panel shown in FIG. 19A. Flexible printed wiring substrates 25 are firmly attached to external input terminal portions 18 and 19 so that the module is electrically connected to an external circuit substrate over which a power supply circuit and a signal processing circuit are formed. As a method for mounting driver ICs 28 which are one kind of external circuits, either a COG technique or a TAB technique may be used. FIG. 19B shows a state in which the driver ICs 28 are mounted by using the COG technique.

Further, the panel and the module correspond to one embodiment of a light emitting device of the present invention, and are included in the scope of the present invention.

Embodiment Mode 12

As electronic appliances mounted with modules in accordance with the present invention, a camera such as a video camera and a digital camera; a goggle type display (a head mounted display); a navigation system; an audio reproducing device (e.g., a car audio component); a computer; a game machine; a portable information terminal (e.g., a mobile computer, a mobile phone, a portable game machine, an electronic book, and the like); an image reproducing device equipped with a recording medium (concretely, a device having a display that can reproduce a recording medium such as a digital versatile disc (DVD) and can display an image thereof); and the like can be given. Specific examples of these electronic appliances are shown in FIGS. 20A to 20E.

FIG. 20A shows a light emitting device such as a monitor screen of a television set or a personal computer. The light emitting device includes a housing 2001, a display portion 2003, speaker portions 2004, and the like. The light emitting device of the present invention has the display portion 2003 with high display quality. To improve the contrast, a polarizing plate or a circular polarizing plate is preferably provided in the display portion. For example, a ¼λ plate, a ½λ plate, and a polarizing plate are preferably provided over a sealing substrate in this order. In addition, an antireflection film may be provided on the polarizing plate.

FIG. 20B shows a mobile phone, including a main body 2101, a housing 2102, a display portion 2103, an audio input portion 2104, an audio output portion 2105, operation keys 2106, an antenna 2108, and the like. The mobile phone of the present invention has the display portion 2103 with high display quality.

FIG. 20C shows a computer, including a main body 2201, a housing 2202, a display portion 2203, a keyboard 2204, an external connection port 2205, a pointing mouse 2206, and the like. The computer of the present invention has the display portion 2203 with high display quality. Although a laptop computer is shown in FIG. 20C, the present invention can be applied to a desktop computer, and the like.

FIG. 20D shows a mobile computer, including a main body 2301, a display portion 2302, a switch 2303, operation keys 2304, an infrared port 2305, and the like. The mobile computer of the present invention has the display portion 2302 with high display quality.

FIG. 20E shows a portable game machine, including a housing 2401, a display portion 2402, speaker portions 2403, operation keys 2404, a recording medium insertion portion 2405, and the like. The portable game machine of the invention has the display portion 2402 with high display quality.

As set forth above, the application range of the present invention is extremely wide so that the present invention can be used for electronic appliances in various fields.

This application is based on Japanese Patent Application Serial No. 2005-082731 filed in Japan Patent Office on Mar. 22, 2005, the entire contents of which are hereby incorporated by reference.

What is claimed is:

1. A light emitting device comprising:
  a first light emitting element and a second light emitting element each comprising:
    a first electrode;
    a second electrode;
    a first light emitting body;
    a second light emitting body over the first light emitting body; and
    a conductive layer between the first light emitting body and the second light emitting body, and
  a partition wall between the first electrode of the first light emitting element and the first electrode of the second light emitting element, wherein the partition wall is formed over an edge portion of the first electrode of the first light emitting element and an edge portion of the first electrode of the second light emitting element,
  wherein the first light emitting body is formed over the first electrode of the first light emitting element, the first electrode of the second light emitting element, and the partition wall,
  wherein the first light emitting body and the second light emitting body are formed between the first electrode and the second electrode, and
  wherein the conductive layer of the first light emitting element and the conductive layer of the second light emitting element are electrically isolated from each other at a portion over the partition wall.

2. The light emitting device according to claim 1, wherein an edge portion of the conductive layer is covered with the first light emitting body and the second light emitting body.

3. The light emitting device according to claim 1, wherein the conductive layer is capable to generate an electron and a hole.

4. The light emitting device according to claim 1, wherein a layer formed using at least a part of compounds included in the first light emitting body and the second light emitting body is provided between adjacent conductive layers which are independent from one another.

5. The light emitting device according to claim 1, wherein an edge portion of the conductive layer is provided outside of an edge portion of a light emitting region in each of the first light emitting element and the second light emitting element.

6. The light emitting device according to claim 1, wherein a second conductive layer is formed in contact with the first electrode.

7. The light emitting device according to claim 1, wherein a second conductive layer is formed in contact with the first electrode and a third conductive layer is formed in contact with the second electrode.

8. The light emitting device according to claim 1, further comprising:
  a transistor electrically connected to the first electrode.

9. A light emitting device comprising:
  a first electrode;
  a second electrode;
  a partition wall between the first electrode and the second electrode, wherein the partition wall is formed over an edge portion of the first electrode and an edge portion of the second electrode;
  a first light emitting layer over the first electrode, the second electrode and the partition wall;
  a first conductive layer over the first electrode with the first light emitting layer interposed therebetween;
  a second conductive layer over the second electrode with the first light emitting layer interposed therebetween;
  a second light emitting layer over the first conductive layer and the second conductive layer; and
  a third electrode over the second light emitting layer,
  wherein the first conductive layer and the second conductive layer are electrically isolated from each other at a portion over the partition wall.

10. The light emitting device according to claim 9, wherein edge portions of the first conductive layer and the second conductive layer are covered with the first light emitting layer and the second light emitting layer.

11. The light emitting device according to claim 9, wherein each of the first conductive layer and the second conductive layer is capable to generate an electron and a hole.

12. The light emitting device according to claim 9, wherein a layer formed using at least a part of compounds included in the first light emitting layer and the second light emitting layer is provided between adjacent conductive layers which are independent from one another.

13. The light emitting device according to claim 9, wherein an edge portion of the first conductive layer is provided outside of an edge portion of a light emitting region.

14. The light emitting device according to claim 9, wherein a third conductive layer is formed in contact with the first electrode.

15. The light emitting device according to claim 9, wherein a third conductive layer is formed in contact with the first electrode and a fourth conductive layer is formed in contact with the third electrode.

16. The light emitting device according to claim 9, further comprising:
a first transistor electrically connected to the first electrode; and
a second transistor electrically connected to the second electrode.

* * * * *